United States Patent
Takino et al.

(10) Patent No.: US 9,477,156 B2
(45) Date of Patent: Oct. 25, 2016

(54) REFLECTING OPTICAL MEMBER, OPTICAL SYSTEM, EXPOSURE APPARATUS, AND DEVICE MANUFACTURING METHOD

(75) Inventors: Hideo Takino, Tokyo (JP); Tetsuya Tomofuji, Machida (JP); Hideki Komatsuda, Ageo (JP); Kohtaro Kasashima, Kumagaya (JP)

(73) Assignee: NIKON CORPORATION, Tokyo (JP)

( * ) Notice: Subject to any disclaimer, the term of this patent is extended or adjusted under 35 U.S.C. 154(b) by 607 days.

(21) Appl. No.: 13/883,362

(22) PCT Filed: Nov. 9, 2011

(86) PCT No.: PCT/JP2011/075788
§ 371 (c)(1),
(2), (4) Date: Aug. 28, 2013

(87) PCT Pub. No.: WO2012/063852
PCT Pub. Date: May 18, 2012

(65) Prior Publication Data
US 2013/0335720 A1 Dec. 19, 2013

(30) Foreign Application Priority Data
Nov. 9, 2010 (JP) .................. 2010-250857

(51) Int. Cl.
*G03B 27/52* (2006.01)
*G03F 7/20* (2006.01)
*G02B 7/182* (2006.01)

(52) U.S. Cl.
CPC ............. *G03F 7/7015* (2013.01); *G02B 7/182* (2013.01); *G03F 7/70075* (2013.01); *G03F 7/70825* (2013.01)

(58) Field of Classification Search
CPC .......... G02B 5/09; G02B 5/08; G02B 7/182; G02B 26/0816; G02B 5/0816; G02B 5/10; G02B 26/0833; G02B 17/0657; G02B 26/12; G02B 5/124; G02B 5/136; G02B 21/04; G02B 17/061; G02B 17/0647; G02B 23/02; G02B 17/004; G02B 26/121; G02B 26/125; G02B 27/0977; G03F 7/702; G03F 7/70825; G03F 7/70058; G03F 7/70116; G03F 7/70075; G03F 7/70066; G03F 7/70233; G03F 7/70833; G03F 7/70775; G03F 7/707; G03F 7/7095; G03F 9/7096; F24J 2002/108; F24J 2/526; F24J 2/5264
See application file for complete search history.

(56) References Cited

U.S. PATENT DOCUMENTS

2011/0235202 A1* 9/2011 Ezawa ...................... F24J 2/16
359/853

OTHER PUBLICATIONS

International Search Report mailed Dec. 6, 2011 in corresponding International Application No. PCT/JP2011/075788.

* cited by examiner

*Primary Examiner* — Mesfin T Asfaw

(57) ABSTRACT

An exit-side fly-eye mirror is provided with a first mirror block having a mirror element as one of a plurality of mirror elements, and a second mirror block having a mirror element as one of the plurality of mirror elements. The first mirror block has a connecting part that protrudes from an area other than the mirror surface of the mirror element, the connecting part providing a connection to the second mirror block. With the connecting part of the first mirror block, a plurality of mirror elements that includes the mirror element of the second mirror block is positioned relative to the mirror element of the first mirror block.

24 Claims, 19 Drawing Sheets

Fig.1
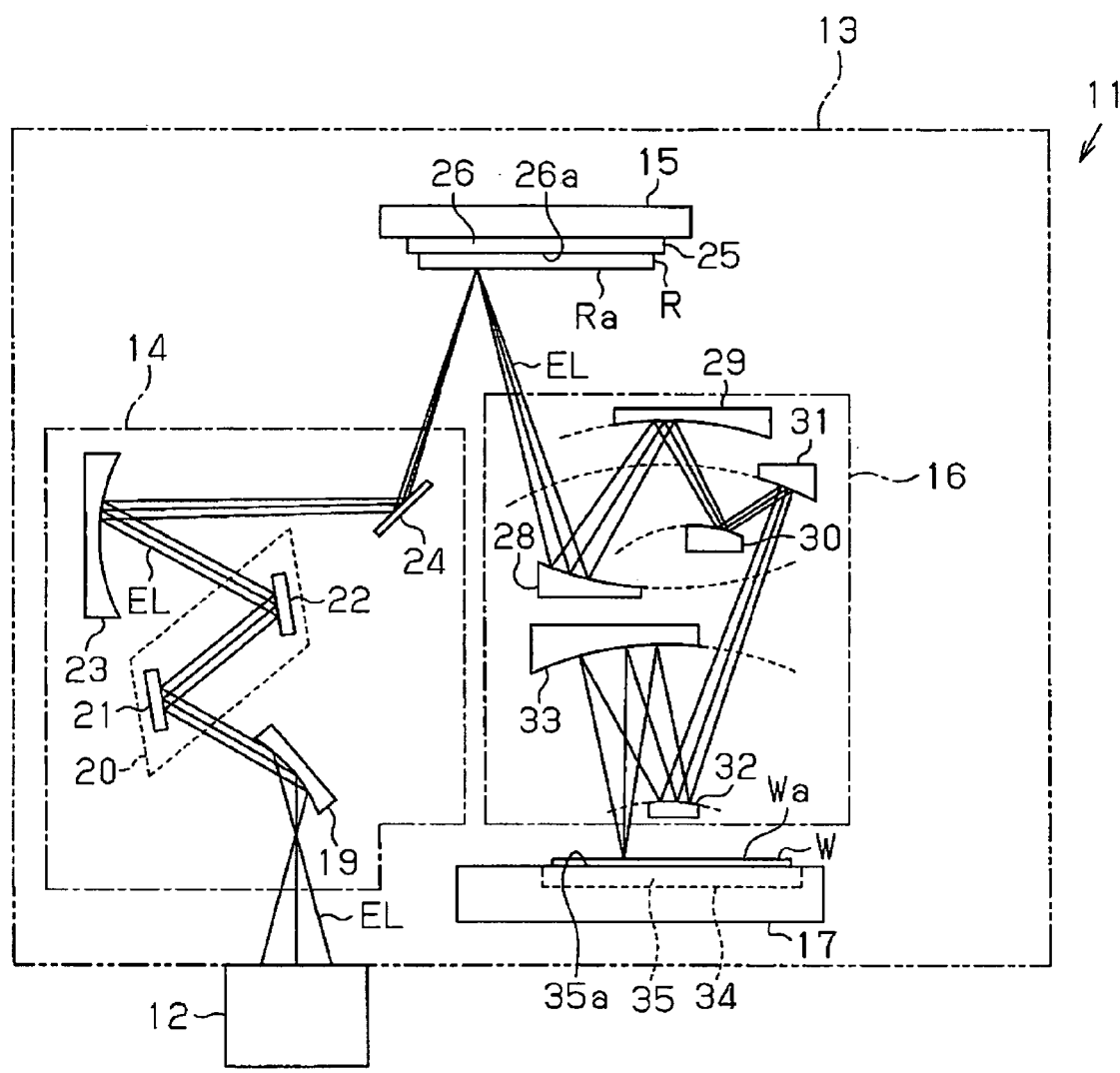
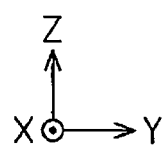

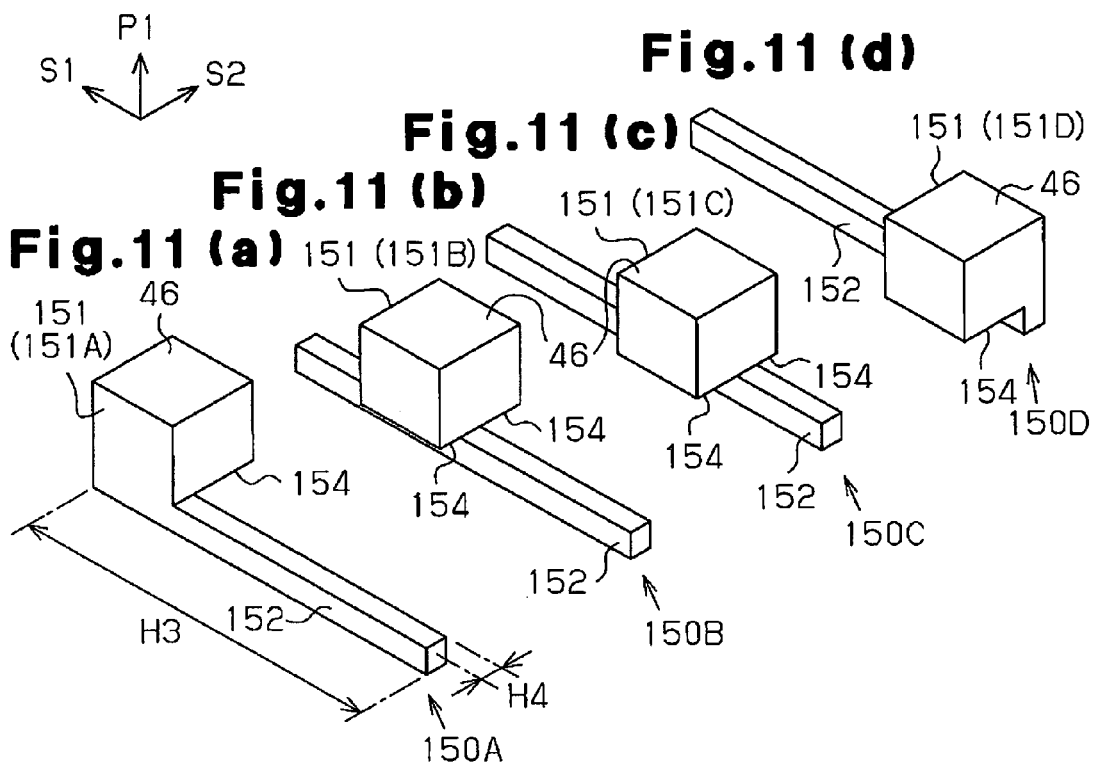
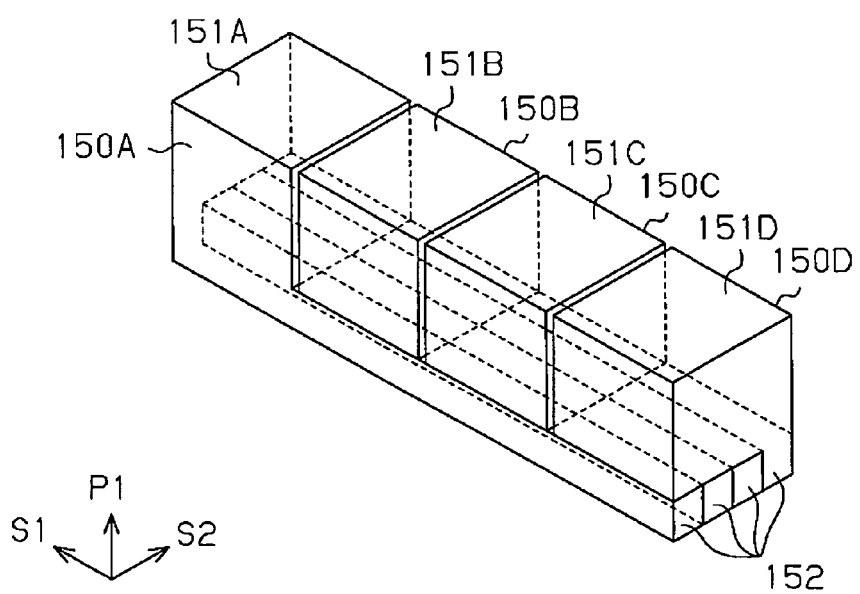

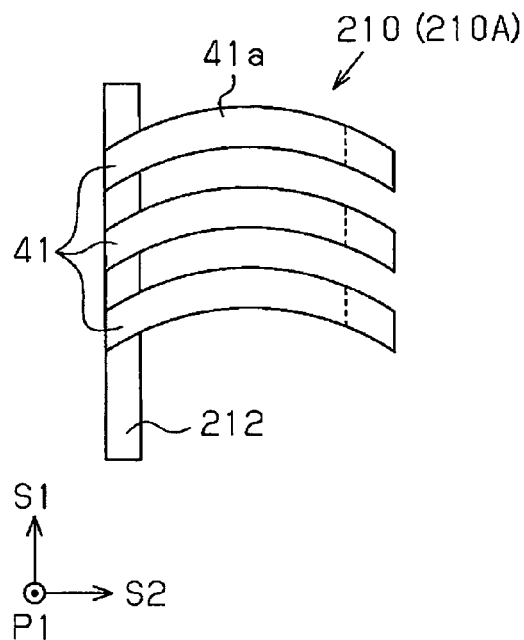
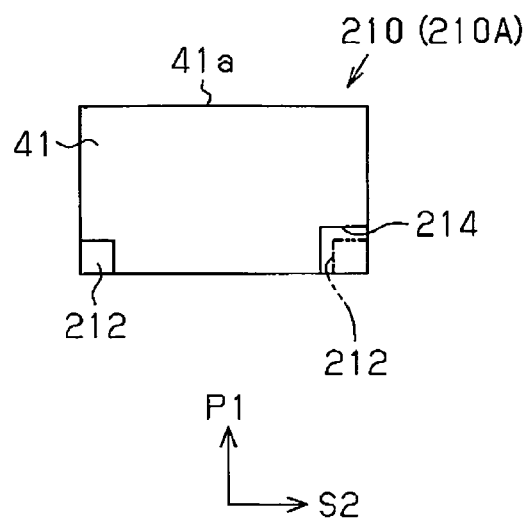
Fig.23(a)   Fig.23(b)
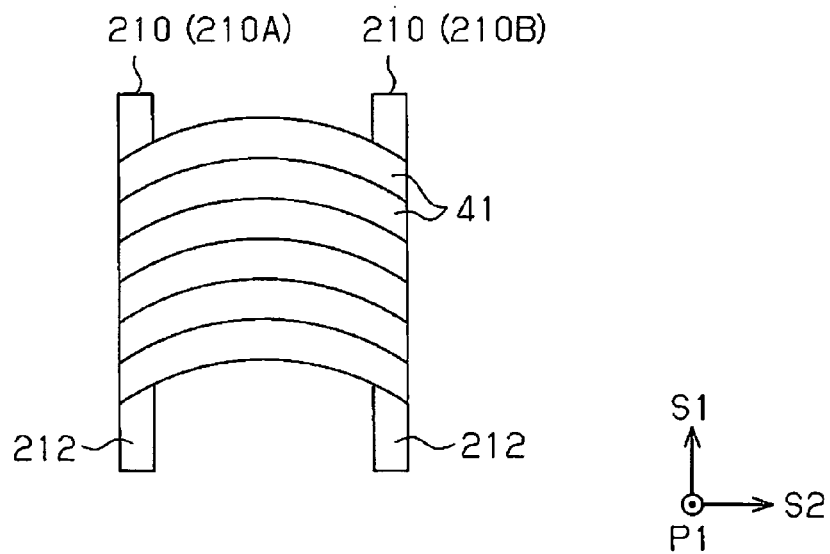
Fig.24

REFLECTING OPTICAL MEMBER, OPTICAL SYSTEM, EXPOSURE APPARATUS, AND DEVICE MANUFACTURING METHOD

CROSS-REFERENCE TO RELATED APPLICATIONS

This application is a U.S. national stage application of PCT/JP2011/075788 filed Nov. 9, 2011 and claims foreign priority benefit of Japanese Application No. 2010-250857 filed Nov. 9, 2010 in the Japanese Intellectual Property Office, the contents of both of which are incorporated herein by reference.

TECHNICAL FIELD

The present invention relates to a reflective optical member including a plurality of mirror elements, an optical system including the reflective optical member, an exposure apparatus including the optical system, and a method for manufacturing a device with the exposure apparatus.

BACKGROUND ART

An exposure apparatus that uses extreme ultraviolet (EUV) light as exposure light (refer to Japanese Laid-Open Patent Publication No. 11-312638) may be a commonly known example of an exposure apparatus that includes a reflective optical member. Such an exposure apparatus includes an illumination optical system including a pair of fly-eye mirrors (reflective optical member), which can function as an optical integrator.

Each fly-eye mirror includes a plurality of mirror blocks, arranged on the setting surface of a base. Each mirror block includes a plurality of mirror elements, which are adjacent to each other in at least one of two perpendicular directions (first and second directions) within the setting surface of the base (refer to US 2007/0273859 A1). Each mirror element has a mirror surface for reflecting incident exposure light. A reflective film is formed on the mirror surface of each mirror element in units of mirror blocks.

Each mirror block of the fly-eye mirror includes a plurality of mirror elements arranged adjacent to each other in at least one of the first and second directions. The mirror blocks are positioned relative to each other and set on the setting surface of the base.

SUMMARY OF THE INVENTION

In one mirror block, a first mirror element is adjacent to a second mirror element in at least one of the first and second directions. In this case, the first mirror element has a side surface facing a side surface of the second mirror element. Two mirror elements of the same mirror block adjacent in the first direction may have a step formed between their mirror surfaces depending on the shape or the orientation of each mirror surface. When a large step is formed between the mirror surfaces, a reflective film may not be formed properly in some areas of the mirror surfaces (hereafter may be referred to as non-film areas). The non-film areas of the mirror surfaces have lower reflection efficiency than the other areas of the mirror surfaces in which the reflective film is formed in an appropriate manner.

Accordingly, it is an object of the present invention to provide a reflective optical member with an improved reflection efficiency, an optical system, an exposure apparatus, and a method for manufacturing a device.

To solve the above problem, the present invention employs the structures described below, which correspond to FIGS. 1 to 26 illustrating the embodiments.

One aspect of the present invention is a reflective optical member (21, 22) including a plurality of mirror elements (41, 51, 51A to 51F, 141, 141A to 141D, 151, 151A to 151D, 161, 161A to 161G, 171, 181, 191, 201, M), each of which includes a reflective portion (41a, 46) for reflecting light (EL). The mirror elements are set on a setting surface (40a, 45a) of a base (40, 45). The reflective optical member includes a first mirror block including a first mirror element among the mirror elements (41, 51, 51A to 51F, 141, 141A to 141D, 151, 151A to 151D, 161, 161A to 161G, 171, 181, 191, 201, M), and a second mirror block including a second mirror element among the mirror elements (41, 51, 51A to 51F, 141, 141A to 141D, 151, 151A to 151D, 161, 161A to 161G, 171, 181, 191, 201, M). The first mirror block includes a coupling portion (52, 62, 142, 152, 162, 172, 182, 192, 202, 212), which protrudes from the first mirror element at a portion differing from the reflective portion (41a, 46). The coupling portion is coupled to the second mirror block. The coupling portion (52, 62, 132, 142, 152, 162, 172, 182, 192, 202, and 212) positions a plurality of mirror elements including the second mirror element relative to the first mirror element.

The above paragraph describes the present invention using reference characters in drawings illustrating the embodiments to facilitate understanding. Nevertheless, the present invention is not limited to the embodiments.

The present invention improves the reflection efficiency of light.

Other aspects and advantages of the present invention will become apparent from the following description, taken in conjunction with the accompanying drawings, illustrating by way of example the principles of the invention.

BRIEF DESCRIPTION OF THE DRAWINGS

The features of the present invention that are believed to be novel are set forth with particularity in the appended claims. The invention, together with objects and advantages thereof, may best be understood by reference to the following description of the presently preferred embodiments together with the accompanying drawings in which:

FIG. 1 schematically shows the structure of an exposure apparatus including a reflective optical member according to a first embodiment;

FIGS. 11(a), 11(b), 11(c), and 11(d) are perspective views each schematically showing a mirror block according to a third embodiment;

FIG. 12 is a schematic view showing a plurality of mirror blocks that have been joined together.

FIG. 23(a) is a plan view schematically showing a mirror block of an incident-side fly-eye mirror in another embodiment, and FIG. 23(b) is a plan view of the mirror block;

FIG. 24 is a plan view schematically showing a plurality of mirror blocks that have been joined together in the other embodiment;

DESCRIPTION OF EMBODIMENTS

First Embodiment

Figure 2A:
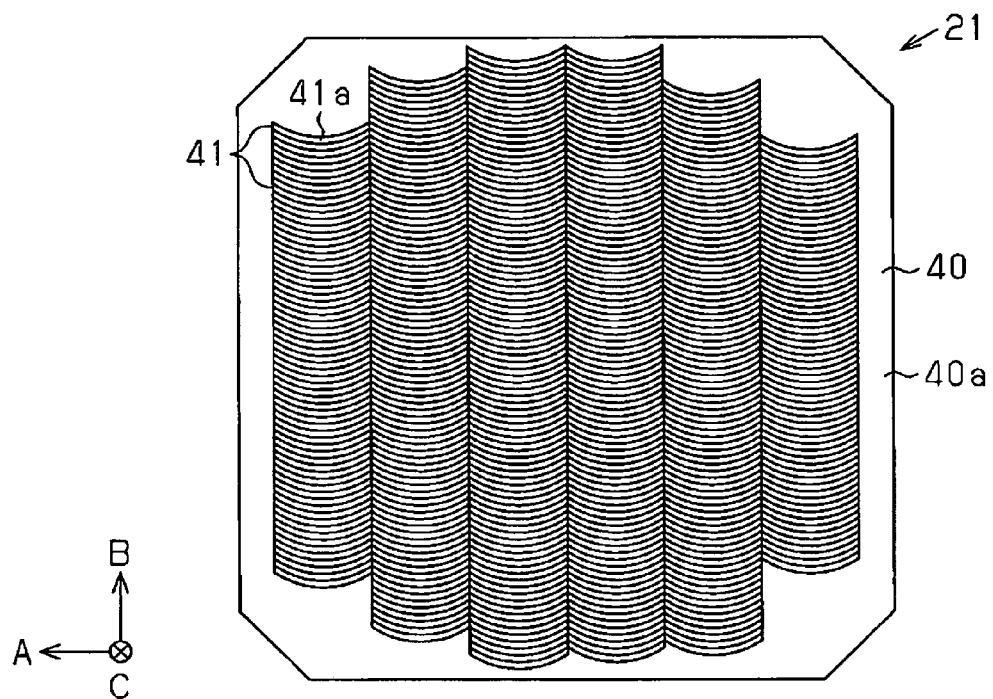
FIGS. 2(*a*) and 2(*b*) are plan views each schematically showing a fly-eye mirror.

One embodiment of the present invention will now be described with reference to FIGS. 1 to 8. In the present embodiment, a direction parallel to an optical axis of a projection optical system is referred to as the Z-direction, a scanning direction in which a reticule or a wafer is scanned across a plane vertical to the Z-direction during scanning exposure is referred to as the Y-direction, and a non-scanning direction perpendicular to the scanning direction is referred to as the X-direction. The directions of rotation about The X-axis, The Y-axis, and The Z-axis are respectively referred to as the θx-direction, the θy-direction, and the θz-direction.

As shown in FIG. 1, an exposure apparatus 11 according to the present embodiment is an EUV exposure apparatus that uses extreme ultraviolet (EUV) light, emitted from a light source unit 12, as exposure light EL. The EUV light has a wavelength in a soft x-ray region, or a wavelength of about 100 nm or less. The exposure apparatus 11 includes a chamber 13 (part surrounded by a double-dashed line in FIG. 1), which has an internal vacuum atmosphere with a pressure lower than the atmospheric pressure. The chamber 13 accommodates an optical system 14 and a reticule holder 15. The optical system 14 illuminates a reflective reticule R, on which a predetermined pattern is formed, with exposure light EL emitted from the light source unit 12 entering the chamber 13. The reticule holder 15 holds the reticule R so that its pattern-formed surface Ra, on which the pattern is formed, faces the −Z side (downward in FIG. 1). The chamber 13 further accommodates a projection optical system 16 and a wafer holding device 17. The projection optical system 16 projects an image of the pattern of the reticule R onto a wafer W, which is coated with photosensitive material, such as resist. The wafer holding device 17 holds the wafer W so that its exposure surface (wafer surface coated with photosensitive material) Wa faces the +Z side (upward in FIG. 1).

The light source unit 12 emits EUV light having a wavelength of 5 to 20 nm as the exposure light EL. The light source unit 12 includes a laser-excited plasma light source and a condensing optical system (not shown). The laser-excited plasma light source generates plasma from a material (target) generating high-density EUV light by using a high-output laser, and emits light including EUV light. The high-output laser may be, for example, a CO2 laser, a YAG laser that uses semiconductor laser excitation, or an excimer laser. The condensing optical system includes at least one reflective optical member. The reflective optical member has a reflective film formed on its reflective surface to reflect the EUV light as exposure light EL with high reflectivity. The reflective film may be, for example, a multilayer film or a laminate of repeated layers of molybdenum (Mo) and silicon (Si). The reflective surface has high reflectivity to EUV light having a wavelength of about 13.5 nm. Thus, the reflective optical member can selectively reflect EUV light having a wavelength of about 13.5 nm. The condensing optical system selectively reflects the EUV light as the exposure light EL, and emits the condensed light into the chamber 13.

The illumination optical system 14 includes a collimating mirror 19, a fly-eye optical system 20, a condenser mirror 23, and a reflective mirror 24. The collimating mirror 19 condenses the exposure light EL, which is emitted from the light source unit 12. The fly-eye optical system 20 achieves a uniform distribution of illumination in an illumination area formed on the reticule R with the exposure light EL. The condenser mirror 23 guides the exposure light EL, which is emitted from the fly-eye optical system 20, to the reticule R. The reflective mirror 24 reflects light. The collimating mirror 19, which is arranged between the light source unit 12 and the fly-eye optical system 20, has a concave mirror surface. The exposure light EL emitted from the light source unit 12 is reflected by the collimating mirror 19, and guided as substantially parallel light to the fly-eye optical system 20.

The fly-eye optical system 20 includes a pair of fly-eye mirrors 21 and 22. Of the fly-eye mirrors 21 and 22, the incident-side fly-eye mirror 21, which is arranged on the incident side, is at a position optically conjugate to the pattern-formed surface Ra of the reticule R. The exposure light EL reflected on the incident-side fly-eye mirror 21 is incident on the emitting-side fly-eye mirror 22, which is arranged on the emitting side. The exposure light EL, which travels through the fly-eye optical system 20 and the condenser mirror 23, illuminates the reticule R with a uniform distribution of illumination in an illumination area formed on the reticule R. The specific structure of each of the fly-eye mirrors 21 and 22 will be described later.

The reflective mirror 24 has a flat mirror surface. The reflective mirror 24 is arranged to illuminate the pattern-formed surface Ra of the reticule R diagonally with the exposure light EL. The exposure light EL, which is reflected by the reflective mirror 24, is incident on the pattern-formed surface Ra of the reticule R at a minimum incident angle and illuminates the pattern-formed surface Ra. This prevents the light from leaving shadow of the patterned recesses formed in the reticule R when the light enters the projection optical system 16. In one example, the incident angle of the light is 10 degrees. The reflective mirror 24 may be eliminated. For example, optimizing the arrangement of the optical system and the shape of the reflective mirrors enables the illumination optical system to be designed without the reflective mirror 24.

The reticule holder 15 is arranged on the object surface side of the projection optical system 16. The reticule holder 15 includes a first electrostatic attraction holding unit 25 for electrostatically attracting the reticule R. The first electrostatic attraction holding unit 25 includes a substrate 26 and a plurality of electrode units (not shown). The substrate 26 is formed from a dielectric material and has an attracting surface 26a. The electrode units are arranged inside the substrate 26. When voltage is applied to each electrode unit from a voltage applying unit (not shown), a coulomb force applied from the substrate 26 electrostatically attracts the reticule R onto the attracting surface 26a.

The reticule holder 15 is movable in the Y-direction (horizontal direction in FIG. 1) when driven by a reticule transporter (not shown). More specifically, the reticule transporter transports the reticule R, which is held on the reticule holder 15, in the Y-direction in predetermined strokes. The reticule transporter can also slightly move the reticule R in the X-direction (direction perpendicular to the plane on which FIG. 1 is drawn), the Z-direction, and the θz-direction. A substantially arc-shaped illumination area extending in the X-direction is formed on the pattern-formed surface Ra of the reticule R when the pattern-formed surface Ra is illuminated with the exposure light EL.

The projection optical system 16 reduces an image of a pattern formed by illuminating the pattern-formed surface Ra of the reticule R with the exposure light EL by a predetermined reduction ratio (e.g., 1/4). The projection optical system 16 includes a plurality of (six in the present embodiment) reflective mirrors 28, 29, 30, 31, 32, and 33. The exposure light EL is guided from the object surface side, on which the reticule R is arranged. The exposure light EL is reflected sequentially on the first mirror 28, the second mirror 29, the third mirror 30, the fourth mirror 31, the fifth mirror 32, and the sixth mirror 33, and guided to an exposure surface Wa of the wafer W, which is held on the wafer holding device 17.

The mirrors 19, 21 to 24, and 28 to 33 of the illumination optical system 14 and the projection optical system 16 each have a reflective layer on their mirror surfaces. The reflective layer reflects the exposure light EL. The reflective layer on each mirror surface is, for example, a multilayer film or a laminate of repeated layers of molybdenum (Mo) and silicon (Si). The reflective layer has high reflectivity to EUV light having a wavelength of about 13.5 nm.

The wafer holding device 17 includes a second electrostatic attraction holding unit 34 for electrostatically attracting the wafer W. The second electrostatic attraction holding unit 34 includes a substrate 35 and a plurality of electrode units (not shown). The substrate 35 is formed from a dielectric material and has an attracting surface 35a. The electrode units are arranged inside the substrate 35. When voltage is applied to each electrode unit from a voltage applying unit (not shown), a coulomb force applied from the substrate 35 electrostatically absorbs the wafer W onto the attracting surface 35a. The wafer holding device 17 includes a wafer holder (not shown), which holds the second electrostatic attraction holding unit 34, and a Z-leveling mechanism (not shown), which adjusts the position of the wafer holder in the Z-direction (vertical direction in FIG. 1) and the angle of inclination of the wafer holder about The X-axis and The Y-axis.

The wafer holding device 17 is movable in the Y-direction when driven by a wafer transporter (not shown). More specifically, the wafer transporter transports the wafer W, which is held on the second electrostatic attraction holding unit 34, in the Y-direction in predetermined strokes. The wafer transporter can also move the wafer W held on the second electrostatic attraction holding unit 34 in the X-direction in predetermined strokes and can slightly move the wafer W in the Z-direction.

To form the pattern of the reticule R in a single shot area of the wafer W, the illumination optical system 14 forms an illumination area on the reticule R. In this state, the reticule transporter is driven to move the reticule R in the Y-direction (e.g., from the +Y side toward the −Y side) in every predetermined stroke. At the same time, the wafer transporter is driven to move the wafer W in the Y-direction (e.g., from the −Y side toward the +Y side) in synchronization with the movement of the reticule R in the Y-direction at a speed corresponding to the reduction ratio of the projection optical system 16. When the pattern formation in the single shot area is completed, subsequent pattern formation is performed sequentially in other shot areas of the wafer W.

The fly-eye mirrors 21 and 22 will now be described with reference to FIGS. 2(a) and 2(b). In the present embodiment, the horizontal direction and the vertical direction in FIGS. 2(a) and 2(b), and the direction perpendicular to the plane of the drawings are respectively referred to as the A-direction, the B-direction, and the C-direction. In the embodiment, the A-direction corresponds to the non-scanning direction (X-direction), the B-direction corresponds to the scanning direction (Y-direction), and the C-direction corresponds to the optical axis direction of the projection optical system (Z-direction).

As shown in FIG. 2(a), the incident-side fly-eye mirror 21 includes an incident-side setting base 40, which is formed by a thick plate of low-expansion steel, such as Inver, or a thick plate of alloy. The incident-side setting base 40 includes an incident-side setting surface 40a, which has been processed, or for example polished, to have a high flatness. A plurality of incident-side mirror elements 41 are arranged on the incident-side setting surface 40a. Each incident-side mirror element 41 has a concave mirror surface 41a with a substantially arc-shaped contour. The concave mirror surface 41a of each incident-side mirror element 41 with a substantially arc-shaped contour enables an arc-shaped illumination area to be formed on the reticule R and the wafer W in conformity with an arch-shaped effective image area and an arch-shaped effective field of view of the projection optical system 16. The plurality of incident-side mirror elements 41 are arranged in the A-direction and the B-direction of the incident-side setting surface 40a. The light flux of the exposure light EL incident on the incident-side fly-eye mirror 21 undergoes wavefront splitting and is split into multiple beams on the mirror surface 41a of each incident-side mirror element 41. Many wavefront-split light beams strike the emitting-side fly-eye mirror 22.

Figure 2B:
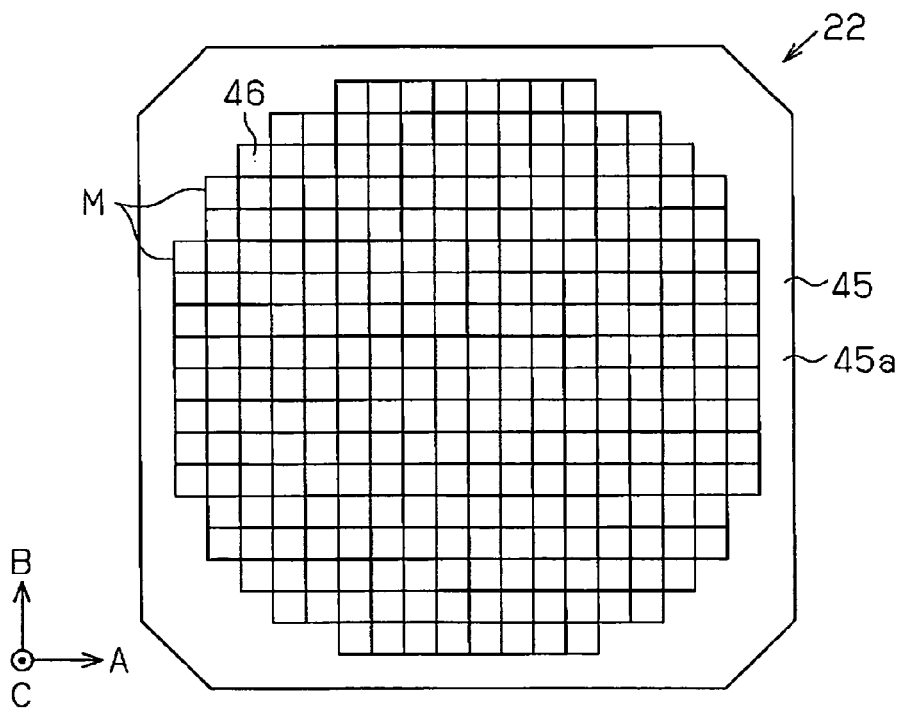

As shown in FIG. 2(b), the emitting-side fly-eye mirror 22 includes an emitting-side setting base 45, which is formed by a thick plate of low-expansion steel, such as Inver, or a thick plate of alloy. The emitting-side setting base 45 includes an emitting-side setting surface 45a, which is processed, or for example polished, to have a high flatness. A plurality of emitting-side mirror elements M are arranged on the emitting-side setting surface 45a. Each emitting-side mirror element M has a curved mirror surface 46. The mirror surface 46 of each emitting-side mirror element M has, for example, a polygonal contour, such as a substantially square contour, or a substantially rectangular or hexagonal contour.

Many light beams wavefront-split at the incident-side mirror elements 41 of the incident-side fly-eye mirror 21 each form a substantially circular secondary light-source image on or in the vicinity of the mirror surface 46 of the corresponding emitting-side mirror element M. The mirror surface 46 of each of the plurality of emitting-side mirror elements M with a substantially polygonal contour reflects such secondary light-source images. Many light beams emitted from the emitting-side fly-eye mirror 22 overlap one another on the pattern-formed surface Ra of the reticle R. This achieves a highly uniform illumination on the reticle R.

The emitting-side fly-eye mirror 22 in the present embodiment includes different types of mirror blocks. Each mirror block includes at least one emitting-side mirror element M and a coupling portion that protrudes from the emitting-side mirror element M at a position different from its mirror surface 46. The coupling portion couples the mirror block to another mirror block. The different types of mirror blocks of the emitting-side fly-eye mirror 22 will now be described with reference to FIGS. 3 to 5. Although each emitting-side mirror element has the concave mirror surface 46, the mirror surface 46 is assumed to be flat to facilitate understanding.

Figure 3A:
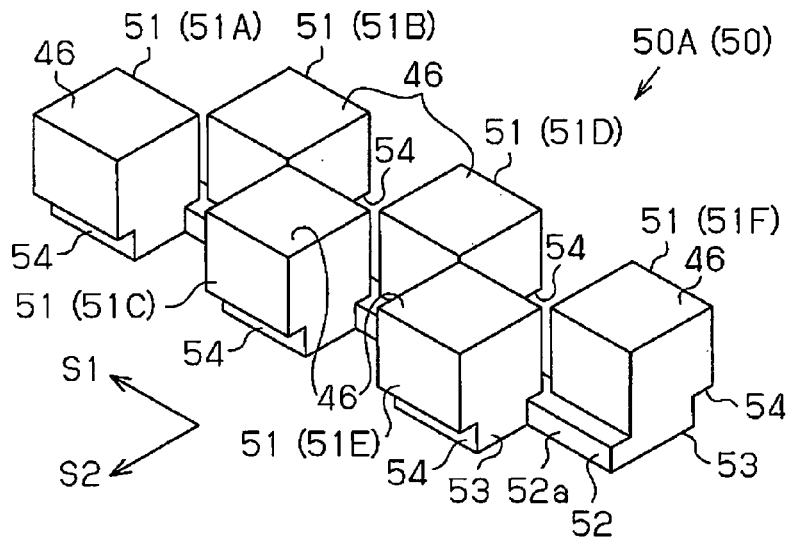
FIGS. 3(*a*), 3(*b*), and 3(*c*) are perspective views each schematically showing a mirror block.

FIG. 3(a) is a perspective view of an example of a mirror block 50 according to the first embodiment of the present invention. The mirror block 50A (50) includes six emitting-side mirror elements 51 (51A, 51B, 51C, 51D, 51E, and 51F), and a coupling portion 52 coupling the six emitting-side mirror elements 51. The emitting-side mirror elements 51 and the coupling portion 52 are formed from the same material. In the present embodiment, a single material is processed into the mirror block 50 having the integral structure of the emitting-side mirror elements 51 and the coupling portion 52.

The six emitting-side mirror elements 51 are arranged at different positions in a first direction S1. For example, the emitting-side mirror elements 51A to 51F are arranged in the order of the emitting-side mirror element 51B, the emitting-side mirror element 510, the emitting-side mirror element 51D, the emitting-side mirror element 51E, and the emitting-side mirror element 51F in the direction from the emitting-side mirror element 51A toward the −S1 side. Among the emitting-side mirror elements 51A to 51F, the emitting-side mirror elements 51A, 51C, and 51E are arranged on the +S2 side (one side) from the coupling portion 52 in a second direction S2, which is perpendicular to (intersects with) the first direction S1. The other emitting-side mirror elements 51B, 51D, and 51F are arranged on the −S2 side (the other side) from the coupling portion 52 in the second direction S2. More specifically, the emitting-side mirror elements 51A to 51F are in a zigzag arrangement with respect to the coupling portion 52. In the first direction S1, a space that can accommodate an emitting-side mirror element of another mirror block is formed between the emitting-side mirror elements 51A and 51C, between the emitting-side mirror elements 51C and 51E, between the emitting-side mirror elements 51B and 51D, and between the emitting-side mirror elements 51D and 51F. Each emitting-side mirror element 51 arranged in the mirror block 50A (e.g., emitting-side mirror element 51A) is not directly coupled to another emitting-side mirror element 51 arranged in the same mirror block 50A (e.g., emitting-side mirror element 51B).

The coupling portion 52 protrudes from the emitting-side mirror elements 51A to 51F at positions opposite to their mirror surfaces 46 (positions different from the mirror surfaces 46) in the first direction S1 and the second direction S2. The emitting-side mirror elements 51A to 51F, supported on the coupling portion 52, are set on the emitting-side setting surface 45a. The coupling portion 52 includes a coupling body 52a, which extends in the first direction S1, and a plurality of (six in this example) protrusions 53 corresponding to each of the emitting-side mirror elements 51A to 51F. The length of the coupling body 52a in the first direction S1 corresponds to the number of emitting-side mirror elements 51A to 51F arranged in the mirror block 50A. The emitting-side mirror elements 51A, 51C, and 51E are arranged on the +S2 side from the center of the coupling body 52a in the second direction S2, whereas the emitting-side mirror elements 51B, 51D, and 51F are arranged on the −S2 side from the center of the coupling body 52a in the second direction S2. In the illustrated example, the emitting-side mirror elements 51A, 51C, and 51E are arranged at fixed intervals in the first direction S1, and the emitting-side mirror elements 51B, 51D, and 51F are also arranged at the same fixed intervals in the first direction S1. The length of the coupling body 52a in the first direction S1 may be longer than the length corresponding to the number of the emitting-side mirror elements 51A to 51F arranged in the mirror block 50A.

The protrusions 53 are arranged at the same positions as the corresponding emitting-side mirror elements 51A to 51F in the first direction S1. In other words, the protrusions 53 are hidden by the emitting-side mirror elements 51A to 51F when the mirror block 50A is viewed in the direction perpendicular to the first direction S1 and the second direction S2 from where the mirror surfaces 46 are arranged. Among the plurality of protrusions 53, the protrusions 53 corresponding to the emitting-side mirror elements 51A, 51C, and 51E protrude from the coupling body 52a to the +S2 side (one side in the second direction S2). However, the distal ends of the protrusions 53 corresponding to the emitting-side mirror elements 51A, 51C, and 51E are positioned further to the −S2 side (the other side in the second direction S2) than the +S2 side ends of the emitting-side mirror elements 51A, 51C, and 51E. Thus, the surfaces of the emitting-side mirror elements 51A, 51C, and 51E opposite to their mirror surfaces 46 and the surfaces of the distal ends of the protrusions 53 define engagement spaces 54, which can accommodate the coupling portion of another mirror block.

The protrusions 53 corresponding to the emitting-side mirror elements 51B, 51D, and 51F protrude from the coupling body 52a to the −S2 side. However, the distal ends of the protrusions 53 corresponding to the emitting-side mirror elements 51B, 51D, and 51F are positioned further to the +S2 side than the −S2 side distal ends of the emitting-side mirror elements 51B, 51D, and 51F. Thus, the surfaces of the emitting-side mirror elements 51B, 51D, and 51F opposite to their mirror surfaces 46 and the surfaces of the distal ends of the protrusions 53 define engagement spaces 54, which can accommodate the coupling portion of another mirror block.

Figure 3B:
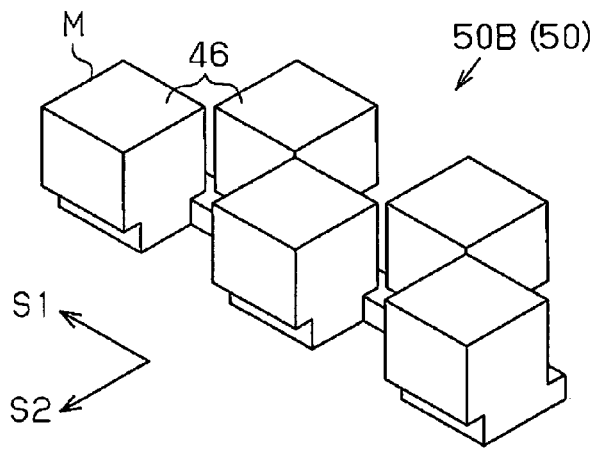
Figure 3C:
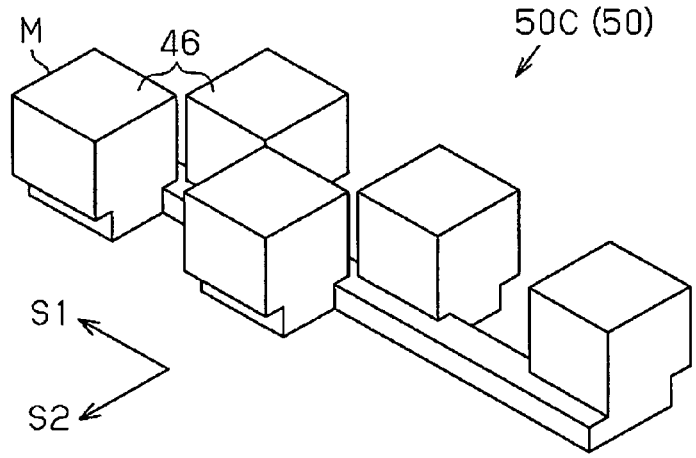
Figure 4A:
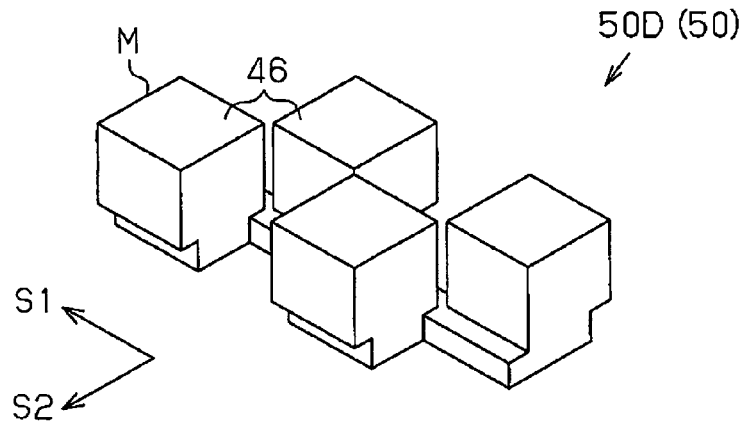
FIGS. 4(*a*), 4(*b*), and 4(*c*) are perspective views each schematically showing a mirror block.
Figure 4B:
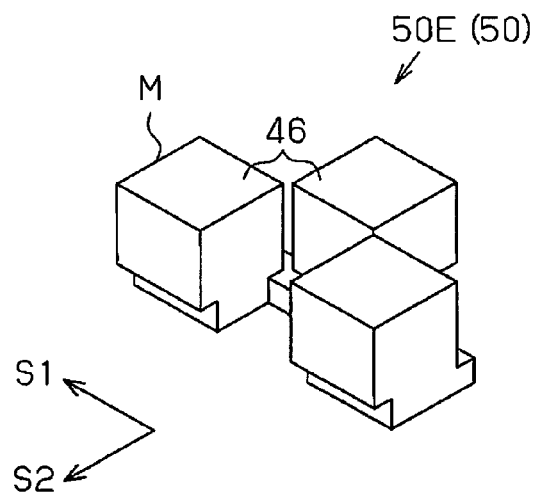
Figure 4C:
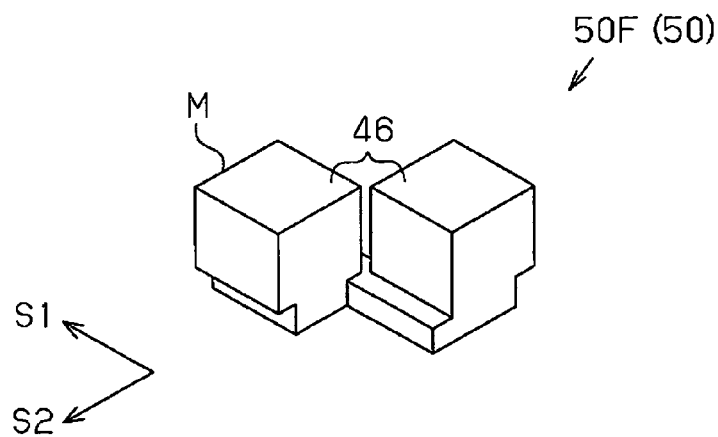

The different types of mirror blocks 50 arranged in the emitting-side fly-eye mirror 22 of the present embodiment may have mirror blocks 50 including any number of emitting-side mirror elements and is not limited to six mirror elements. As shown in FIGS. 3(b) and 3(c), for example, mirror blocks 50B and 50C each include five emitting-side mirror elements M. The mirror block 50B includes five emitting-side mirror elements M in a zigzag arrangement. The mirror block 50C includes no emitting-side mirror element M at the position corresponding to the emitting-side mirror element 51E of the mirror block 50A. The mirror blocks should not be limited to such arrangements of emitting-side mirror elements M. The mirror blocks may include mirror elements in various arrangements, and may be mirror blocks 50D, 50E, 50F, 50G, 50H, and 50I shown in FIGS. 4(a) to 4(c) and FIGS. 5(a) to 5(c). The mirror blocks 50H and 50I shown in FIGS. 5(b) and 5(c) each include a single emitting-side mirror element M and a coupling portion 62. The length of the coupling portion 62 of such mirror blocks 50H and 50I in the first direction S1 may be longer than the length of the single emitting-side mirror element M in the first direction S1.

In one mirror block (e.g., mirror block 50A), as shown in FIG. 3(a), two emitting-side mirror elements having the facing side surfaces (e.g., the emitting-side mirror element 51A and the emitting-side mirror element 51C) allow an emitting-side mirror of another element mirror block to be arranged between these mirror elements. One emitting-side mirror element (e.g., emitting-side mirror element 51A) of one mirror block (e.g., mirror block 50A) is adjacent to another emitting-side mirror element (e.g., emitting-side mirror element 51B). However, the emitting-side mirror element 51A and the emitting-side mirror element 51B are arranged so that the single vertexes of their mirror surfaces 46 face each other. More specifically, one emitting-side mirror element and another emitting-side mirror element in the same mirror block are adjacent to each other only with extremely narrow facing areas. Thus, the mirror surface 46 of one emitting-side mirror element can be processed without being greatly affected by the other emitting-side mirror element. This allows the mirror surface 46 of one emitting-side mirror element to be processed into an intended shape. In particular, this structure improves the processing accuracy of the edges of the mirror surface 46.

The reflective film is formed on the mirror surface 46 of each emitting-side mirror element before the mirror blocks are joined together. The reflective film can thus be formed on the mirror surface 46 of one emitting-side mirror element of one mirror block (e.g., mirror block 50A) without greatly affected by another mirror element. The reflective film can be formed appropriately on the edges of the mirror surface 46 of each emitting-side mirror element of one mirror block. This allows the entire mirror surface 46 to be processed into a practical mirror surface that can practically reflect the exposure light EL.

The emitting-side fly-eye mirror 22 of the present embodiment includes the above plurality of different types of mirror blocks 50A to 50I, which are joined together and set on the emitting-side setting surface 45a. The structure including three mirror blocks 50A will now be described with reference to FIGS. 6(a) and 6(b) and FIG. 7. Among the three mirror blocks 50A, the mirror block 50A in the middle in FIGS. 6(a) and 6(b) will be referred to as a "first mirror block 50A1," the mirror block 50A on the right is referred to as a "second mirror block 50A2," and the mirror block 50A on the left is referred to as a "third mirror block 50A3."

Figure 6A:
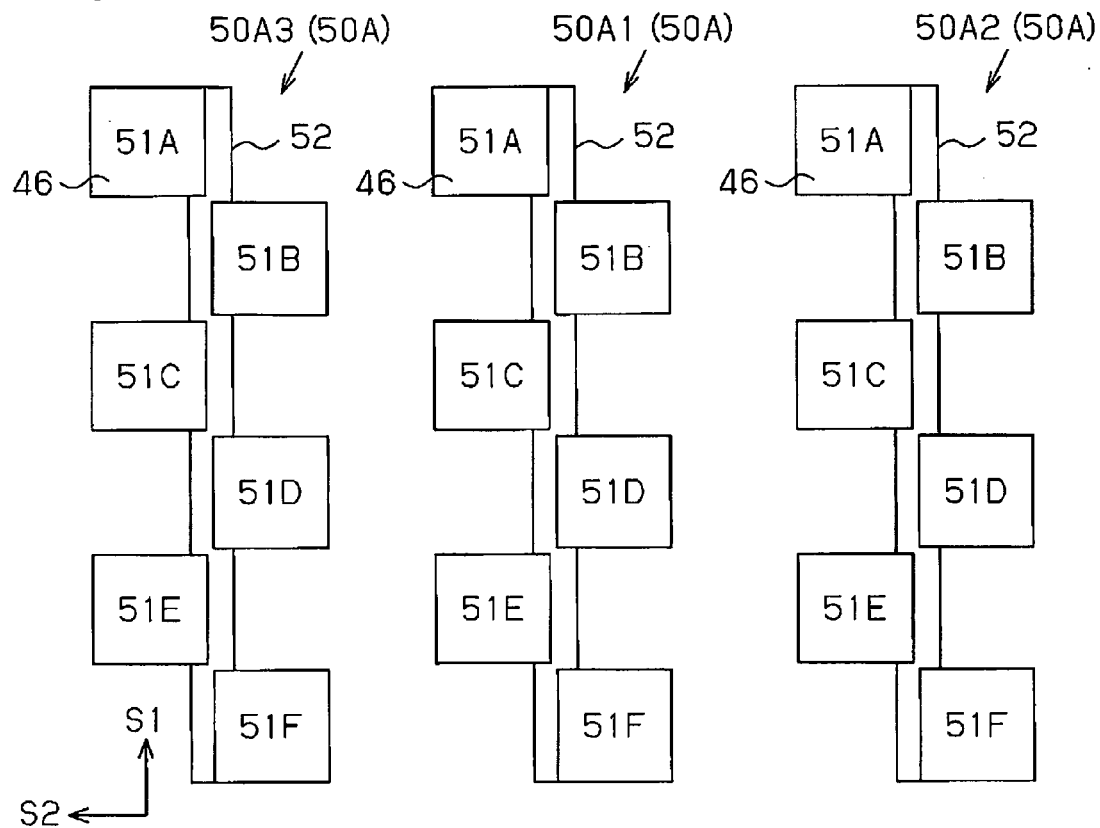
FIG. 6(*a*) is a plan view schematically showing a plurality of mirror blocks that are yet to be joined together, and FIG. 6(*b*) is a plan view schematically showing the plurality of mirror blocks that have been joined together.
Figure 6B:
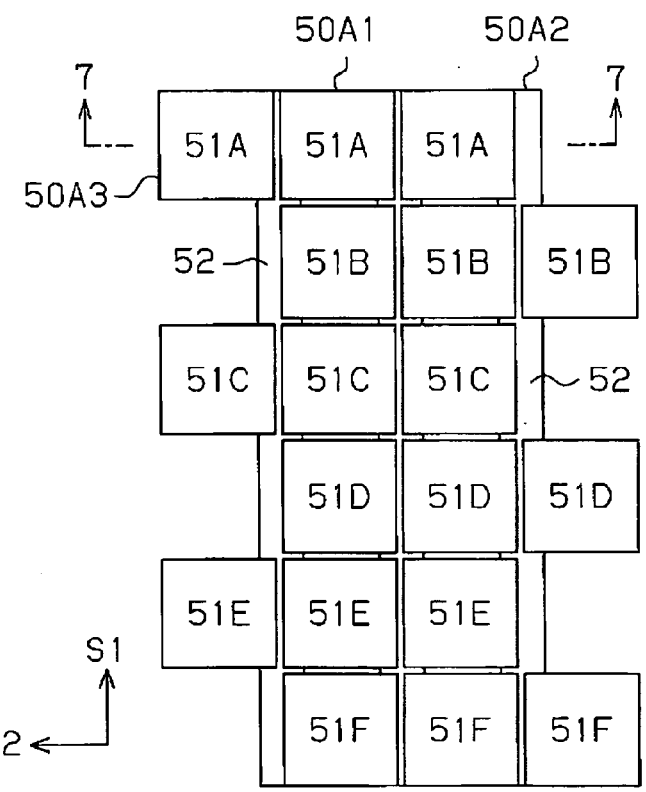

As shown in FIGS. 6(a) and 6(b), when the first mirror block 50A1 and the second mirror block 50A2 are joined together, the emitting-side mirror element 51B of the first mirror block 50A1 is arranged between the emitting-side mirror elements 51A and 51C of the second mirror block 50A2 in the first direction S1 (vertical direction in FIG. 6). The emitting-side mirror element 51D of the first mirror block 50A1 is arranged between the emitting-side mirror elements 51C and 51E of the second mirror block 50A2 in the first direction S1. The emitting-side mirror element 51F of the first mirror block 50A1 is arranged on the −S1 side (downward FIG. 6) of the emitting-side mirror element 51E of the second mirror block 50A2. In this structure, the emitting-side mirror elements 51B, 51D, and 51F of the first mirror block 50A1 are adjacent to the emitting-side mirror elements 51B, 51D, and 51F of the second mirror block 50A2 on the −S2 side (on the right in FIG. 6).

Likewise, when the first mirror block 50A1 and the third mirror block 50A3 are joined together, the emitting-side mirror element 51A of the first mirror block 50A1 is arranged on the +S1 side (upward in FIG. 6) of the emitting-side mirror element 51B of the third mirror block 50A3. The emitting-side mirror element 51C of the first mirror block 50A1 is arranged between the emitting-side mirror elements 51B and 51D of the third mirror block 50A3 in the first direction S1. Further, the emitting-side mirror element 51E of the first mirror block 50A1 is arranged between the emitting-side mirror elements 51D and 51F of the third mirror block 50A3 in the first direction S1. In this structure, the emitting-side mirror elements 51B, 51D, and 51F of the first mirror block 50A1 are adjacent to the emitting-side mirror elements 51B, 51D, and 51F of the third mirror block 50A3 on the +S2 side (on the left in FIG. 6).

More specifically, when the emitting-side mirror element 51B of the first mirror block 50A1 is a first mirror element, the emitting-side mirror element 51C of the second mirror block 50A2 corresponds to a second mirror element, the emitting-side mirror element 51C of the first mirror block 50A1 corresponds to a fourth mirror element, and the emitting-side mirror element 51D of the first mirror block 50A1 corresponds to a fifth mirror element, and at least one of the emitting-side mirror elements 51A to 51F arranged in the third mirror block 50A3 corresponds to a third mirror element.

When the emitting-side mirror element 51D of the first mirror block 50A1 is the first mirror element, the emitting-side mirror element 51E of the second mirror block 50A2 corresponds to the second mirror element, the emitting-side mirror element 51E of the first mirror block 50A1 corresponds to the fourth mirror element, the emitting-side mirror element 51F of the first mirror block 50A1 corresponds to the fifth mirror element, and one of the emitting-side mirror elements 51A to 51F of the third mirror block 50A3 corresponds to the third mirror element.

Figure 7:
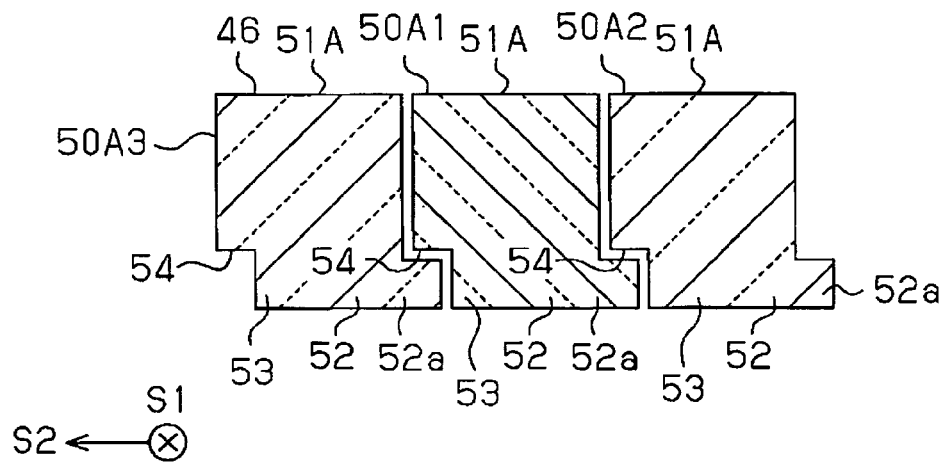
FIG. 7 is a cross-sectional view taken along line 7-7 in FIG. 6(*b*)

When the mirror blocks 50A are joined together in this manner, as shown in FIG. 7, the engagement spaces 54 formed at positions opposite to the mirror surfaces 46 of the emitting-side mirror elements 51A, 51C, and 51E of the second mirror block 50A2 accommodate a part of the coupling portion 52 of the first mirror block 50A1 (−S2 side). The engagement spaces 54 formed at positions opposite to the mirror surfaces 46 of the emitting-side mirror elements 51B, 51D, and 51F of the first mirror block 50A1 accommodate a part of the coupling portion 52 of the second mirror block 50A2 (+S2 side).

More specifically, in the present embodiment, the part of the coupling portion 52 of the first mirror block 50A1 is accommodated (engaged) in the engagement spaces 54 of the second mirror block 50A2 to couple the first mirror block 50A1 to the second mirror block 50A2. The part of the coupling portion 52 of the second mirror block 50A2 is accommodated in the engagement spaces 54 of the first mirror block 50A1 to couple the second mirror block 50A2 to the first mirror block 50A1. The coupling portion 52 of the first mirror block 50A1 positions the emitting-side mirror elements 51A to 51F arranged in the second mirror block 50A2 relative to the emitting-side mirror elements 51A to 51F arranged in the first mirror block 50A1.

Likewise, the engagement spaces 54 formed at positions opposite to the mirror surfaces 46 of the emitting-side mirror elements 51A, 51C, and 51E of the first mirror block 50A1 accommodate a part of the coupling portion 52 of the third mirror block 50Ae (on part the −S2 side). The engagement spaces 54 formed at positions opposite to the mirror surfaces 46 of the emitting-side mirror elements 51B, 51D, and 51F of the third mirror block 50A3 accommodate a part of the coupling portion 52 of the first mirror block 50A1 (+S2 side).

More specifically, in the present embodiment, the part of the coupling portion 52 of the first mirror block 50A1 is accommodated in the engagement spaces 54 of the third mirror block 50A3 to couple the first mirror block 50A1 to the third mirror block 50A3. The part of the coupling portion 52 of the third mirror block 50A3 is accommodated in the engagement spaces 54 of the first mirror block 50A1 to couple the third mirror block 50A3 to the first mirror block 50A1. The coupling portion 52 of the first mirror block 50A1 positions the emitting-side mirror elements 51A to 51F arranged in the third mirror block 50A3 relative to the emitting-side mirror elements 51A to 51F arranged in the first mirror block 50A1.

The plurality of coupling bodies 52a included in the plurality of mirror blocks of the emitting-side fly-eye mirror 22 each have the same shape. The plurality of engagement spaces 54 included in the plurality of mirror blocks of the emitting-side fly-eye mirror 22 may each have the same shape.

Figure 5A:
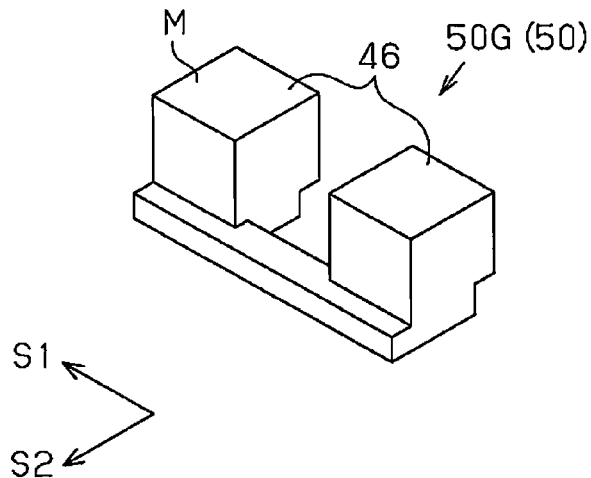
FIGS. 5(*a*), 5(*b*), and 5(*c*) are perspective views each schematically showing a mirror block.
Figure 5B:
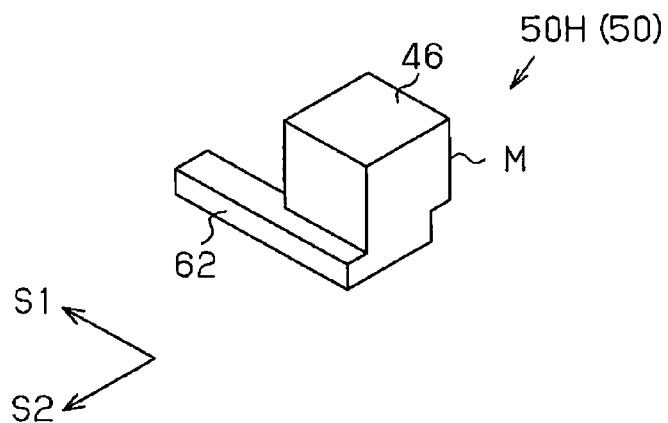
Figure 8:
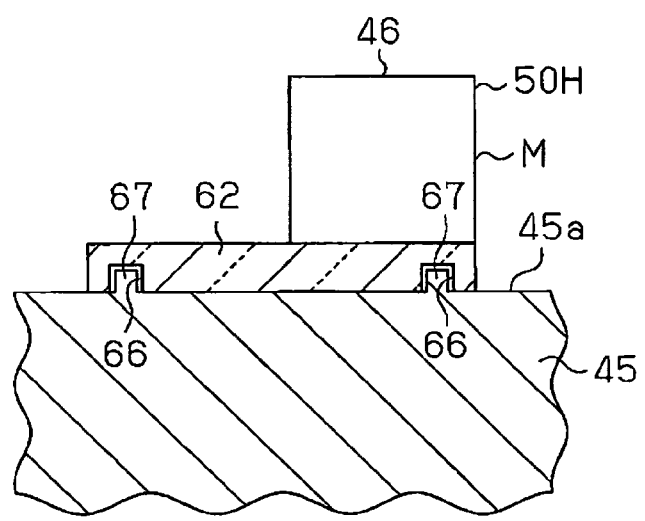
FIG. 8 is a cross-sectional view of a mirror block that has been positioned and set on the emitting-side setting surface.

The mirror blocks of the emitting-side fly-eye mirror 22 are all joined together and then set on the emitting-side setting surface 45a. A method for setting the mirror blocks will now be described with reference to FIG. 8. FIG. 8 shows an example in which the mirror block 50H shown in FIG. 5(b) is set on the emitting-side setting surface 45a.

As shown in FIG. 8, positioning recesses 66 are formed on the two ends of the coupling portion 62 in the longitudinal direction (the first direction S1 in this example). The positioning recesses 66 are open toward the emitting-side setting surface 45. Also, positioning protrusions 67 are arranged on the emitting-side setting surface 45a at positions corresponding to the positioning recesses 66. The positioning protrusions 67 are arranged in (engaged with) the positioning recesses 66 to position the mirror block 50B on the emitting-side setting surface 45a. This positioning mechanism can position the mirror block 50B on the emitting-side setting surface 45a more accurately when the positioning protrusions 67 are spaced more from each other. Subsequently, the mirror block 50B is fixed to the emitting-side setting base 45 with, for example, bolts (not shown).

Although the embodiment describes the method for setting the mirror block 50H, different types of mirror blocks can also be positioned and set on the emitting-side setting surface 45a with the same method as described above. The above positioning mechanism may include positioning protrusions on the mirror block 50, and positioning recesses on the emitting-side setting surface 45a.

In the present embodiment, when all of the mirror blocks are positioned relative to each other and then set on the emitting-side setting surface 45a, each mirror block is not in contact with other mirror blocks adjacent to it in the first direction S1 and the second direction S2 (refer to FIG. 7). In other words, gaps are left between the adjacent mirror blocks for tolerances occurring during manufacture of the mirror blocks. Each emitting-side mirror element M is arranged at an appropriate position of the emitting-side setting surface 45a without being affected by such tolerances. This further allows the plurality of emitting-side mirror elements M to be arranged without wasting space on the emitting-side setting surface 45a.

The present embodiment has the advantages described below.

(1) One emitting-side mirror element (e.g., emitting-side mirror element 51A) of one mirror block (e.g., mirror block 50A) is not adjacent to other emitting-side mirror elements (emitting-side mirror element 51B to 51F in this example) of the same mirror block in the first and second directions S1 and S2. As compared with the structure in which one mirror block includes one emitting-side mirror element and another emitting-side mirror element adjacent to each other in the first direction S1 or in the second direction S2, the structure of the embodiment allows the mirror surface 46 of one emitting-side mirror element 51 to be processed easily. In particular, this structure improves the processing accuracy of the edges of the mirror surface 46 of each emitting-side mirror element. This structure also allows the reflective film to be formed on the entire mirror surface 46 of each emitting-side mirror element (e.g., emitting-side mirror element 51A) of one mirror block in an appropriate manner. More specifically, the entire mirror surface 46 can be processed into a practically usable mirror surface. As compared with the structure in which the reflective film is not formed properly on parts (e.g., edges) of the mirror surface 46, this structure improves the reflection efficiency of the emitting-side fly-eye mirror 22. In this specification, the term "being adjacent" refers to "two mirror elements M being arranged densely with a gap based on a tolerance being left between the mirror elements", and the term "not being adjacent" refers to "two mirror elements M being spaced from each other with a gap much larger than a gap based on a tolerance being left between the mirror elements." For example, the emitting-side mirror element 51A and the emitting-side mirror element 51C of the mirror block 50A1 are spaced from each other by at least a distance that allows another mirror element 51 to be placed between the mirror elements 51A and 51C in the first direction S1. In this case, the mirror elements 51A and 51C are "not adjacent."

(2) In one mirror block, the side surfaces of the adjacent emitting-side mirror elements M do not face each other. Unlike a mirror block including a plurality of emitting-side mirror elements M that are arranged so that their side surfaces face each other, this structure allows the mirror surface 46 of each emitting-side mirror element M to be processed easily. In particular, this structure improves the processing accuracy of the edges of the mirror surface 46 of each emitting-side mirror element M. This structure also allows the reflective film to be formed on the entire mirror surface 46 of each emitting-side mirror element M of the mirror block. More specifically, this structure allows the entire mirror surface 46 to be processed into a practically usable mirror surface. As compared with the structure in which the reflective film is not formed on part (e.g., edges) of the mirror surface 46, this structure improves the reflection efficiency of the emitting-side fly-eye mirror 22.

(3) The coupling portion of the first mirror block positions the second mirror block, which is adjacent to the first mirror block, relative to the first mirror block. This structure enables a plurality of mirror blocks to be joined together easily.

Figure 5C:
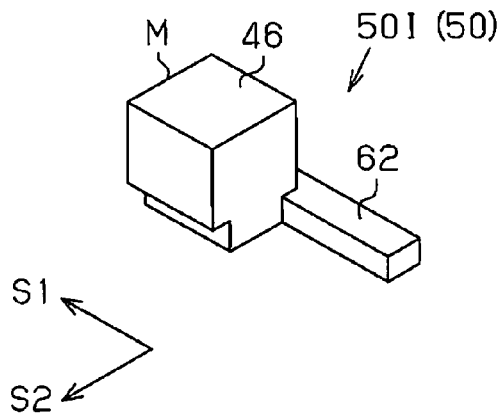

(4) The emitting-side fly-eye mirror 22 in the present embodiment includes the mirror blocks 50H and 50I (refer to FIGS. 5(b) and 5(c)), each of which includes one emitting-side mirror element M. Accurately positioning each emitting-side mirror element M independently on the emitting-side setting surface 45a would be difficult. In this regard, the mirror blocks 50H and 50I in the present embodiment each include the coupling portion 62 extending in the first direction S1, in addition to including the emitting-side mirror element M. More specifically, the length of each of the mirror blocks 50H and 50I in the longitudinal direction (the length in the first direction S1 in this example) is longer than the length of the emitting-side mirror element M in the longitudinal direction. Thus, the positioning mechanism on the two ends of each of the mirror blocks 50H and 50I in the longitudinal direction can position the mirror blocks 50H and 50I in an appropriate manner and can set the mirror blocks 50H and 50I on the emitting-side setting surface 45a. This structure improves the positioning accuracy of each emitting-side mirror element M on the emitting-side setting surface 45a, and accordingly improves the reflection efficiency of the emitting-side fly-eye mirror 22.

(5) The improved reflection efficiency of the emitting-side fly-eye mirror 22 enables a higher illumination on the reticle R or the wafer W, and thus improves the throughput of the exposure apparatus 11.

(6) When the mirror blocks 50 are joined together, each mirror block 50 is held by a special jig or the like on the coupling portion. As compared with the structure in which the emitting-side mirror elements M of each mirror block 50 are held by a jig or the like, the structure of the embodiment reduces damage on the emitting-side mirror elements M or damage on the reflective film formed on the mirror surface 46 occurring during the assembly process.

(7) When, for example, the coupling portion 52 of each mirror block 50A includes no protrusions 53, the area of contact between each mirror block 50A and the emitting-side setting base 45 is smaller. In this case, heat generated on the mirror block 50A when the exposure light EL enters the mirror block is less easily released to the emitting-side setting base 45. In this regard, the coupling portion 52 of the mirror block 50A in the present embodiment includes the protrusions 53. This structure increases the area of contact between each mirror block 50A and the emitting-side setting base 45. This structure efficiently releases heat, generated in the mirror block 50A when the exposure light EL enters the mirror block, to the emitting-side setting base 45, and accordingly prevents the mirror surfaces of the incident-side fly-eye mirror 21 from being deformed by such heat generation. The other types of mirror blocks 50B to 50I also have the same advantages as described above.

Second Embodiment

A second embodiment of the present invention will now be described with reference to FIGS. 9 and 10. The second embodiment differs from the first embodiment in the arrangement of emitting-side mirror elements on the coupling portion. Accordingly, the description hereafter will mainly focus on portions differing from the first embodiment. Same reference numerals are given to those components that are the same as the corresponding components of the first embodiment. Such components will now be described again.

Figure 9A:
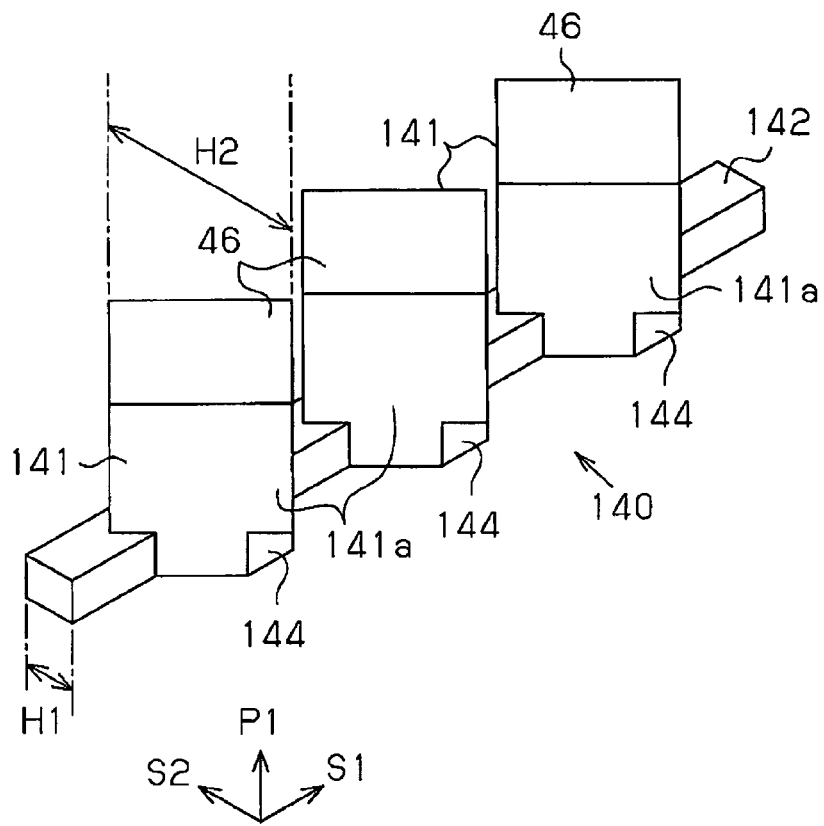
FIGS. 9(a) and 9(b) are perspective views each schematically showing a mirror block according to a second embodiment.
Figure 9B:
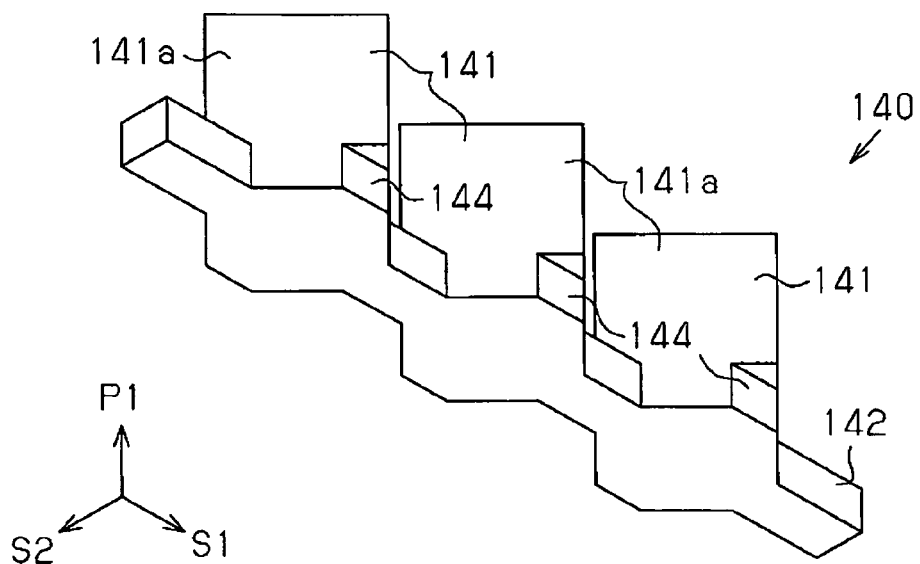

As shown in FIGS. 9(a) and 9(b), each mirror block 140 of an emitting-side fly-eye mirror 22 includes a plurality of (three in FIG. 9) emitting-side mirror elements 141, which are arranged in the first direction S1. Each emitting-side mirror element 141 has a substantially square mirror surface 46 as viewed from above. The emitting-side mirror elements 141 are arranged so that one vertex of the mirror surface 46 of one emitting-side mirror element 141 faces one vertex of the mirror surface 46 of another emitting-side mirror element 141 adjacent in the first direction S1. In this case, one of the two diagonal lines of the mirror surface 46 extends in the first direction S1. The emitting-side mirror elements 141 may be arranged so that one of the diagonal lines of the mirror surface 46 extends in the first direction S1, or the diagonal line may extend in a direction different from the first direction S1. In this arrangement, in one mirror block 140, a side surface 141a of one emitting-side mirror element 141 (that is, a surface substantially perpendicular to an emitting-side setting surface 45a) does not face a side surface 141a of another emitting-side mirror element 141.

Also, the mirror block 140 includes a coupling portion 142, which protrudes from a side wall of the emitting-side mirror element 141 (that is, a position different from the mirror surface 46) in the first direction S1. The coupling portion 142 couples emitting-side mirror elements 141 that are adjacent to each other in the first direction S1. In the present embodiment as well, the emitting-side mirror elements 141 of the single mirror block 140 are not directly coupled to each other. The length of the coupling portion 142 in the second direction S2, that is, a width H1 of the coupling portion 142, is narrower than the length of the emitting-side mirror element 141 in the second direction S2, that is, a width H2 of the emitting-side mirror element 141. For example, the width H1 of the coupling portion 142 is less than one half of the width H2 of the emitting-side mirror element 141. The coupling portion 142 comes in contact with the emitting-side setting surface 45a when the mirror block 140 is set on the emitting-side setting surface 45a.

Each mirror block 140 has engagement spaces 144, which can accommodate a part of the coupling portion 142 of another mirror block 140 adjacent in the second direction S2. Each engagement space 144 is formed by cutting a part of the side wall of the corresponding emitting-side mirror element 141. In the present embodiment, the engagement spaces 144 are formed on both ends of each emitting-side mirror element 141 in the second direction S2.

Figure 10A:
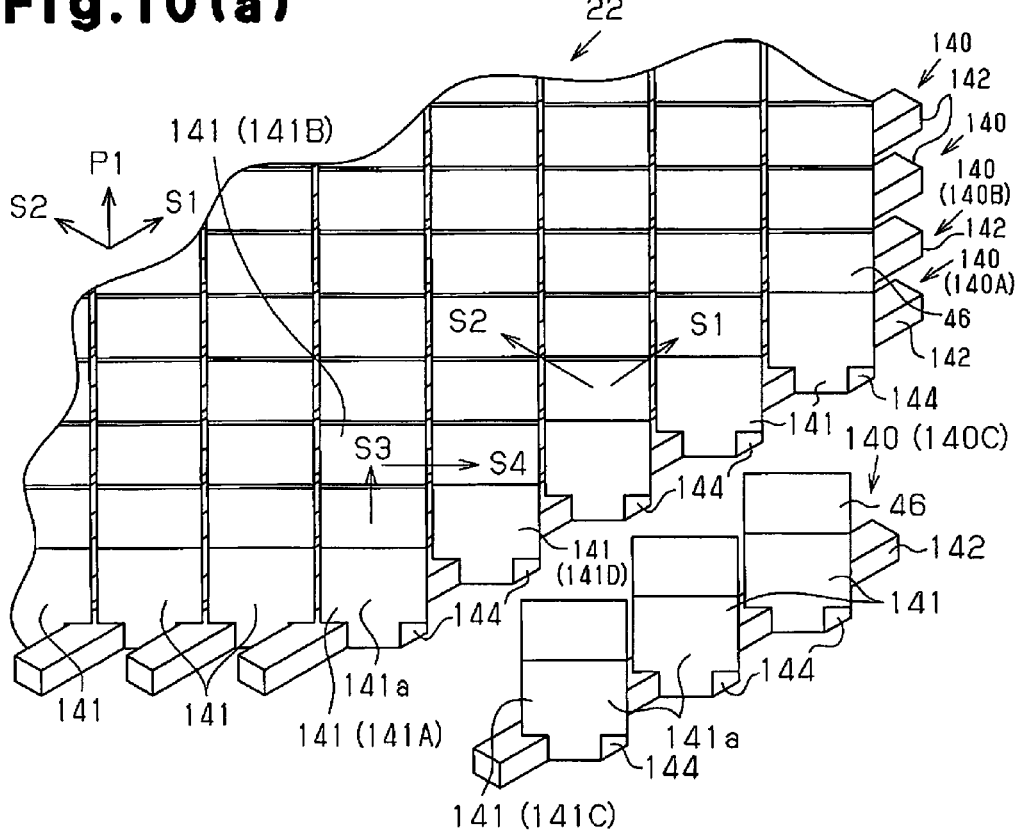
FIGS. 10(a) and 10(b) are perspective views showing a plurality of mirror blocks that have been joined together.
Figure 10B:
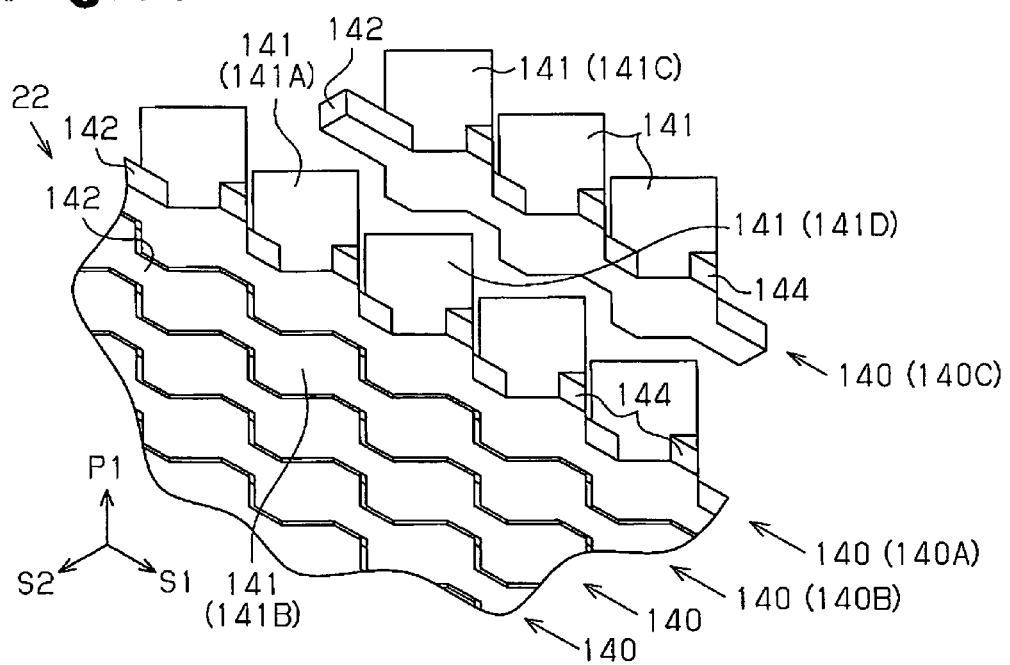

As shown in FIGS. 10(a) and 10(b), the emitting-side fly-eye mirror 22 includes the plurality of mirror blocks 140, which are arranged in parallel in the second direction S2. The coupling portion 142 of each mirror block is engaged with the engagement spaces 144 of another mirror block. This couples the plurality of mirror blocks to each other.

Among the emitting-side mirror elements 141 of the first mirror block 140A (140), the first emitting-side mirror element 141A is adjacent to the second emitting-side mirror element 141B in a third direction S3a, among the emitting-side mirror elements 141 of the second mirror block 140B (140) arranged on the +S2 side of the first mirror block 140A. The third direction S3a intersects with both of the first direction S1 and the second direction S2. The first emitting-side mirror element 141A and the second emitting-side mirror element 141B are adjacent to each other so that their side surfaces 141a face each other. The third direction S3 may be, for example, a direction obtained by rotating the first direction S1 counterclockwise by 45 degrees within the emitting-side setting surface 45a.

Among the emitting-side mirror elements 141 of the first mirror block 140A, the fourth emitting-side mirror element 141D, which is arranged on the +S1 side of the first emitting-side mirror element 141A, is adjacent to the second emitting-side mirror element 141B arranged in a fourth direction S4a, which intersects with the third direction S3. The fourth emitting-side mirror element 141D and the second emitting-side mirror element 141B are adjacent to each other so that their side surfaces 141a face each other. The fourth direction S4 is a direction along the emitting-side setting surface 45a.

Among the engagement spaces 144 of the first mirror block 140A, each engagement space 144 on the +S2 side accommodates a part of the coupling portion 142 of the second mirror block 140B. Among the engagement spaces 144 of the second mirror block 140B, each engagement space 144 on the −S2 side accommodates a part of the coupling portion of the first mirror block 140A. This couples the second mirror block 140B to the first mirror block 140A. The emitting-side mirror elements 141 of the first mirror block 140A positions the emitting-side mirror elements 141 of the second mirror block 140B.

Likewise, the first emitting-side mirror element 141A of the first mirror block 140A is adjacent to the third emitting-side mirror element 141C in the fourth direction S4 among the emitting-side mirror elements 141 of the third mirror block 140C (140), which are arranged on the −S2 side of the first mirror block 140A. The fourth emitting-side mirror element 141D of the first mirror block 140A is adjacent to the third emitting-side mirror element 141C in the third direction S3.

Among the engagement spaces 144 of the first mirror block 140A, each engagement space 144 on the −S2 side accommodates a part of the coupling portion 142 of the third mirror block 140C. Among the engagement spaces 144 of the third mirror block 140C, each engagement space 144 on the +S2 side accommodates a part of the coupling portion 142 of the first mirror block 140A. This couples the third mirror block 140C to the first mirror block 140A. The emitting-side mirror elements 141 of the first mirror block 140A position the emitting-side mirror elements 141 of the third mirror block 140C.

All the mirror blocks 140 of the emitting-side fly-eye mirror 22 are joined together as described above. The mirror blocks, which are positioned relative to each other, are then set on the emitting-side setting surface 45a. The method used for such setting is the same as described in the first embodiment, and will not be described.

The present embodiment has the same advantages as the advantages (2) to (6) of the first embodiment.

Third Embodiment

A third embodiment of the present invention will now be described with reference to FIGS. 11 and 12. The third embodiment differs from the first and second embodiments in the shape of the mirror blocks arranged in the emitting-side fly-eye mirror 22. Accordingly, the description hereafter will mainly focus on portions differing from the first and second embodiments. Same reference numerals are given to those components that are the same as the corresponding components of the first and second embodiments. Such components will now be described again.

An emitting-side fly-eye mirror 22 of the present embodiment includes a plurality of (four in this example) different types of mirror blocks 150A, 150B, 150C, and 150D, which are shown in FIGS. 11(a), 11(b), 11(c), and 11(d). Each of the mirror blocks 150A to 150D includes a single emitting-side mirror element 151 (151A, 151B, 151C, or 151D), and a coupling portion 152, which protrudes from the emitting-side mirror element 151 at a position different from its mirror surface 46. The coupling portion 152 extends in the first direction S1. A length H3 of the coupling portion 152 in the first direction S1 is a length corresponding to N emitting-side mirror elements 151 (N is a natural number equal to or greater than 2, and is 4 in the present embodiment). In the present embodiment, the length H3 of the coupling portion 152 is slightly longer than a length corresponding to four emitting-side mirror elements 151. The length of the coupling portion 152 in the second direction S2, or a width H4 of the coupling portion 152, is less than one half of the length of the emitting-side mirror element 151 in the second direction S2, that is, the width of the emitting-side mirror element 151. More specifically, the width H4 of the coupling portion 152 is less than 1/N of the width of the emitting-side mirror element 151.

As shown in FIG. 11(a), the mirror block 150A includes an emitting-side mirror element 151A, which is arranged at the +S1 side end of the coupling portion 152. The coupling portion 152 is arranged on the emitting-side mirror element 151A at a position opposite to its mirror surface 46. More specifically, the emitting-side mirror element 151A, supported by the coupling portion 152, is set on the emitting-side setting surface 45a. The −S2 side end of the emitting-side mirror element 151A is aligned with the −S2 side end of the coupling portion 152 in the second direction S2. The surface of the emitting-side mirror element 151A opposite to the mirror surface 46 and the +S2 side surface of the coupling portion 152 define an engagement space 154.

As shown in FIGS. 11(b) and 12, the mirror block 150B includes an emitting-side mirror element 151B, which is arranged on the −S1 side of the emitting-side mirror element 151A. The coupling portion 152 is arranged on the emitting-side mirror element 151B at a position opposite to its mirror surface 46. The coupling portion 152 of the mirror block 150B is on the +S2 side of the coupling portion 152 of the mirror block 150A. The surface of the emitting-side mirror element 151B opposite to the mirror surface 46 and the −S2 side surface of the coupling portion 152 define a first engagement space 154. The surface of the emitting-side mirror element 151B opposite to the mirror surface 46 and the +S2 side surface of the coupling portion 152 define a second engagement space 154.

As shown in FIGS. 11(c) and 12, the mirror block 150C includes an emitting-side mirror element 151C, which is arranged on the −S1 side of the emitting-side mirror element 151B. The coupling portion 152 is arranged on the emitting-side mirror element 151C at a position opposite to its mirror surface 46. The coupling portion 152 of the mirror block 150C is arranged on the +S2 side of the coupling portion 152 of the mirror block 150B. The surface of the emitting-side mirror element 151C opposite to the mirror surface 46 and the −S2 side surface of the coupling portion 152 define a first engagement space 154. The surface of the emitting-side mirror element 151C opposite to the mirror surface 46 and the +S2 side surface of the coupling portion 152 define a second engagement space 154.

As shown in FIG. 11(d) and FIG. 12, the mirror block 150D includes an emitting-side mirror element 151D, which is arranged on the −S1 side of the emitting-side mirror element 151C. The coupling portion 152 is arranged on the emitting-side mirror element 151D at a position opposite to its mirror surface 46. The emitting-side mirror element 151D is arranged on the −S1 side end of the coupling portion 152.

The coupling portion 152 of the mirror block 150D is arranged on the +S2 side of the coupling portion 152 of the mirror block 150C. The +S2 side end of the coupling portion 152 is aligned with the +S2 side end of the emitting-side mirror element 151D in the second direction S2. The surface of the emitting-side mirror element 151D opposite to the mirror surface 46 and the −S2 side surface of the coupling portion 152 define an engagement space 154.

The N (four in this example) different types of mirror blocks 150A to 150D are joined together as shown in FIG. 12. More specifically, the mirror blocks 150A to 150D are joined together so that the two ends of the different blocks are aligned in the first direction S1. As a result, the emitting-side mirror element 151A, the emitting-side mirror element 151B, the emitting-side mirror element 151C, and the emitting-side mirror element 151D are arranged sequentially from the +S1 side to the −S1 side.

In this arrangement, the engagement space 154 of the mirror block 150A accommodates the +S1 side end of the coupling portion 152 of each of the other mirror blocks 150B to 150D. The first engagement space 154 of the mirror block 150B accommodates a part of the coupling portion 152 of the mirror block 150A. The second engagement space 154 of the mirror block 150B accommodates a part of the coupling portion 152 of each of the mirror blocks 150C and 150D. The first engagement space 154 of the mirror block 150C accommodates a part of the coupling portion 152 of each of the mirror blocks 150A and 150B. The second engagement space 154 of the mirror block 150C accommodates a part of the coupling portion 152 of the mirror block 150D. The engagement space 154 of the mirror block 150D accommodates the −S1 side end of the coupling portion 152 of each of the other mirror blocks 150A to 150C.

When the mirror block 150A is assumed to be a first mirror block, the other mirror blocks 150B to 150D are coupled to the mirror block 150A. The other emitting-side mirror elements 151B to 151D are positioned relative to the emitting-side mirror element (first mirror element) 151A.

Subsequently, the emitting-side mirror elements 151A to 151D, in which the N (four in this example) different types of mirror blocks 150A to 150D are joined together, are set on the emitting-side setting surface 45a. A plurality of groups of blocks, each including an N number of different types of mirror blocks 150A to 150D that are joined together, are set on the emitting-side setting surface 45a. In the present embodiment as well, the mirror blocks 150A to 150D are positioned relative to each other and set on the emitting-side setting surface 45a. The method used for such setting is the same as described in the first embodiment, and will not be described.

The present embodiment has the advantage described below in addition to the advantages (1) and (3) to (6) of the above embodiments.

(8) For the emitting-side fly-eye mirror 22 of each of the above embodiments, all of the mirror blocks need to be removed from the emitting-side setting surface 45a when only some of the emitting-side mirror element 151 are to be replaced. In contrast, for the emitting-side fly-eye mirror 22 of the present embodiment, only a group of blocks including the emitting-side mirror elements 151 to be replaced (refer to FIG. 12) need to be removed from the emitting-side setting surface 45a. In other words, this structure eliminates the need to remove all of the mirror blocks from the emitting-side setting surface 45a. This simplifies the maintenance of the emitting-side fly-eye mirror 22 involving replacement of some of the emitting-side mirror elements 151.

Fourth Embodiment

A fourth embodiment of the present invention will now be described with reference to FIGS. 13 and 14. The fourth embodiment differs from the first to third embodiments in the shape of the mirror blocks arranged in the emitting-side fly-eye mirror 22. Accordingly, the description hereafter will mainly focus on portions differing from the first to third embodiments. Same reference numerals are given to those components that are the same as the corresponding components of the first to third embodiments. Such components will now be described again.

Figure 13:
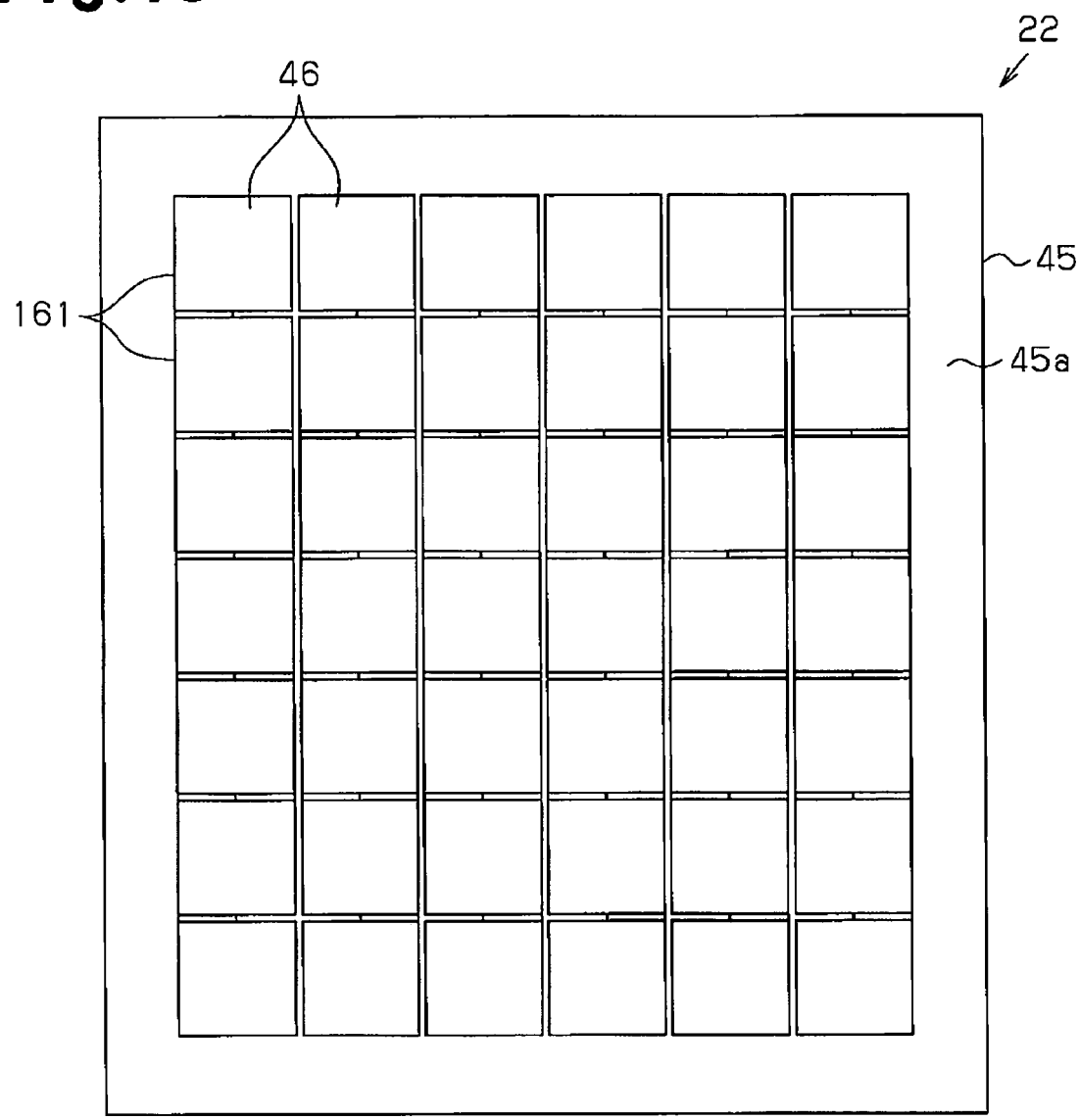
FIG. 13 is a schematic plan view of an emitting-side fly-eye mirror according to a fourth embodiment.

FIG. 13 is a plan view showing a simplified structure of an emitting-side fly-eye mirror 22. As shown in FIG. 13, the emitting-side fly-eye mirror 22 includes a plurality of (seven in FIG. 13) emitting-side mirror elements 161 arranged in the first direction S1. Each line of emitting-side mirror elements 161 forms two mirror blocks.

Figure 14A:
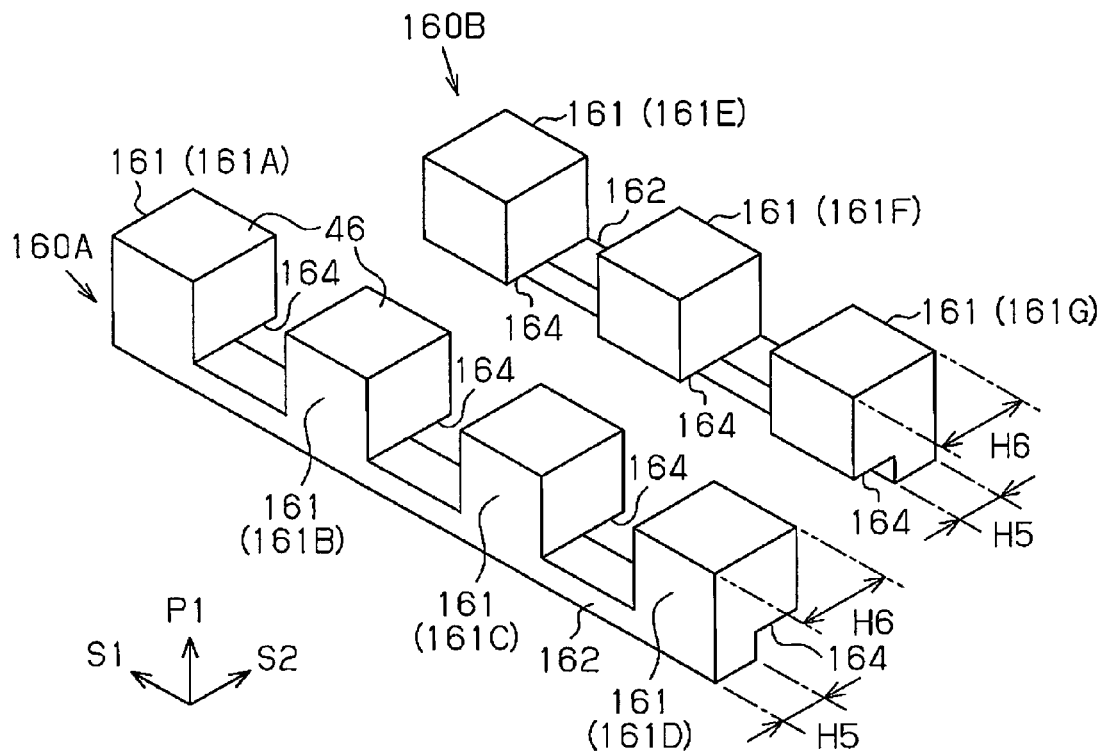
FIG. 14(a) is a perspective view showing a plurality of mirror blocks that are yet to be joined together.
Figure 14B:
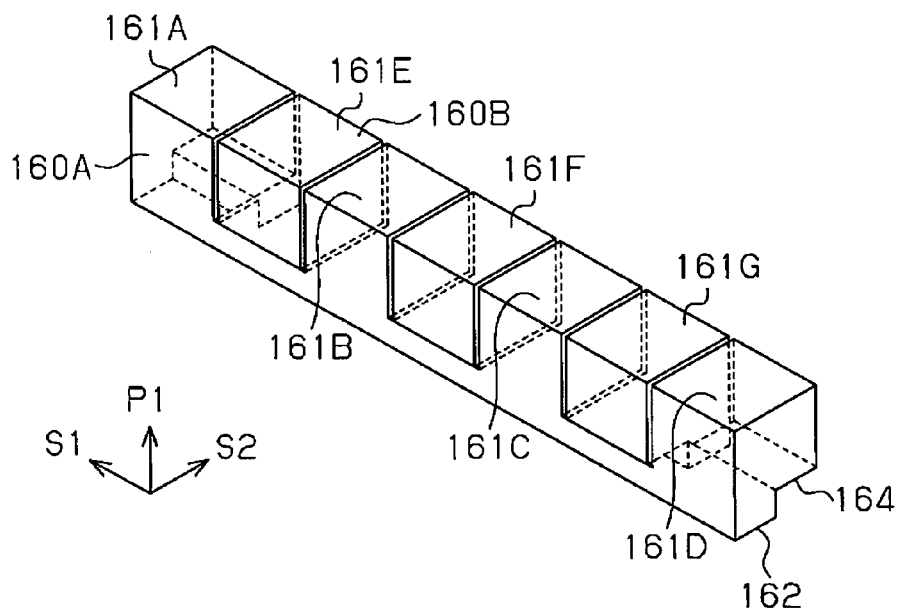
FIG. 14(b) is a perspective view showing the mirror blocks that have been joined together.

As shown in FIGS. 14(a) and 14(b), the emitting-side fly-eye mirror 22 includes two different types of mirror blocks 160A and 160B. The mirror block 160A includes emitting-side mirror elements 161A, 161B, 161C, and 161D, which are arranged sequentially from the +S1 side to the −S1 side. Among the emitting-side mirror elements 161A to 161D, the emitting-side mirror element 161A is arranged most outwardly on the +S1 side among the emitting-side mirror elements 161 of the emitting-side fly-eye mirror 22. The emitting-side mirror element 161D is arranged most outwardly on the −S1 side among the emitting-side mirror elements 161A to 161D of the emitting-side fly-eye mirror 22. In the first direction S1, a space that can accommodate an emitting-side mirror element 161 of another mirror block 160B is left between the emitting-side mirror elements 161A and 161B, between the emitting-side mirror elements 161B and 161C, and between the emitting-side mirror elements 161C and 161D.

The mirror block 160A includes a coupling portion 162, which protrudes from the emitting-side mirror elements 161A to 161D at positions different from their mirror surfaces 46. The coupling portion 162 at the positions opposite to the mirror surfaces 46 of the emitting-side mirror elements 161A to 161D extends in the first direction S1. More specifically, the emitting-side mirror elements 161A to 161D, supported on the coupling portion 162, are set on the emitting-side setting surface 45a. The length of the coupling portion 162 in the second direction S2, that is, a width H5 of the coupling portion 162, is less than one half of the length of the emitting-side mirror elements 161A to 161D in the second direction S2, that is, a width H6 of the emitting-side mirror elements 161A to 161D. The −S2 side end of the coupling portion 162 is aligned with the −S2 side ends of the emitting-side mirror elements 161A to 161D. The surfaces of the emitting-side mirror elements 161A to 161D opposite to their mirror surfaces 46 and the +S2 side surface of the coupling portion 162 define engagement spaces 164.

The mirror block 160B includes an emitting-side mirror element 161E between the emitting-side mirror elements 161A and 161B, an emitting-side mirror element 161F between the emitting-side mirror elements 161B and 161C, and an emitting-side mirror element 161G between the emitting-side mirror elements 161C and 161D in the first direction S1. In the first direction S1, a space that can accommodate an emitting-side mirror element 161 (161B or 161C) of the other mirror block 160A is left between the emitting-side mirror elements 161E and 161F and between the emitting-side mirror elements 161F and 161G.

The mirror block 160B includes a coupling portion 162, which protrudes from the emitting-side mirror elements 161E to 161G at positions different from their mirror surfaces 46. The coupling portion 162, at the positions different from the mirror surfaces 46 of the emitting-side mirror elements 161E to 161G, extends in the first direction S1. More specifically, the emitting-side mirror elements 161E to 161G, supported on the coupling portion 162, are set on the emitting-side setting surface 45a. The length of the coupling portion 162 in the second direction S2, that is, a width H5 of the coupling portion 162, is less than one half of the length of the emitting-side mirror elements 161E to 161G in the second direction S2, that is, a width H6 of the emitting-side mirror elements 161E to 161G. The +S2 side end of the coupling portion 162 is aligned with the +S2 side ends of the emitting-side mirror elements 161E to 161G. The surfaces of the emitting-side mirror elements 161E to 161G opposite to their mirror surfaces 46 and the −S2 side surface of the coupling portion 162 define engagement spaces 164.

The mirror block 160A and the mirror block 160B are joined together so that the engagement spaces 164 of the mirror block 160A accommodate a part of the coupling portion 162 of the mirror block 160B. As a result, the engagement spaces 164 of the mirror block 160B accommodate a part of the coupling portion 162 of the mirror block 160A. More specifically, the mirror blocks 160A and 160B are coupled together with their coupling portions 162. This positions the emitting-side mirror element 161E between the emitting-side mirror elements 161A and 161B, and the emitting-side mirror element 161F between the emitting-side mirror elements 161B and 161C, and further the emitting-side mirror element 161G between the emitting-side mirror elements 161C and 161D. In other words, the coupling portions 162 of the mirror blocks 160A and 160B position the emitting-side mirror elements (the second mirror elements) 161E to 161G of the mirror block 160B relative to the emitting-side mirror elements (the first mirror elements) 161A to 161D of the mirror block 160A.

Subsequently, the mirror blocks 160A and 160B are set on the emitting-side setting surface 45a. In the present embodiment as well, the mirror blocks 160A and 160B are positioned relative to each other and set on the emitting-side setting surface 45a. The method used for such setting is the same as described in the first embodiment, and will not be described.

The present embodiment has the same advantages as the advantages (1), (3) to (6), and (8) of the above embodiments.

Fifth Embodiment

A fifth embodiment of the present invention will now be described with reference to FIGS. 15 and 17. The fifth embodiment differs from the second embodiment in the position of the coupling portion of the mirror block. Accordingly, the description hereafter will mainly focus on portions differing from the second embodiment. Same reference numerals are given to those components that are the same as the corresponding components of the second embodiment. Such components will now be described again.

Figure 15:
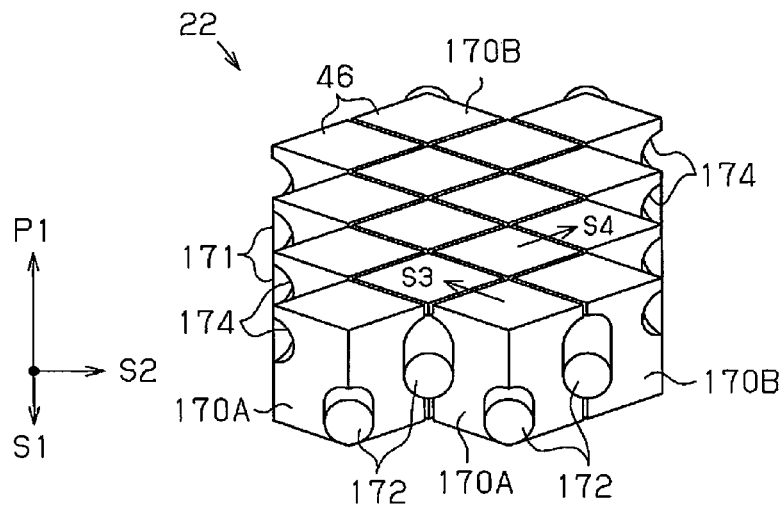
FIG. 15 is a perspective view showing a plurality of mirror blocks that have been joined together in a fifth embodiment.
Figure 16:
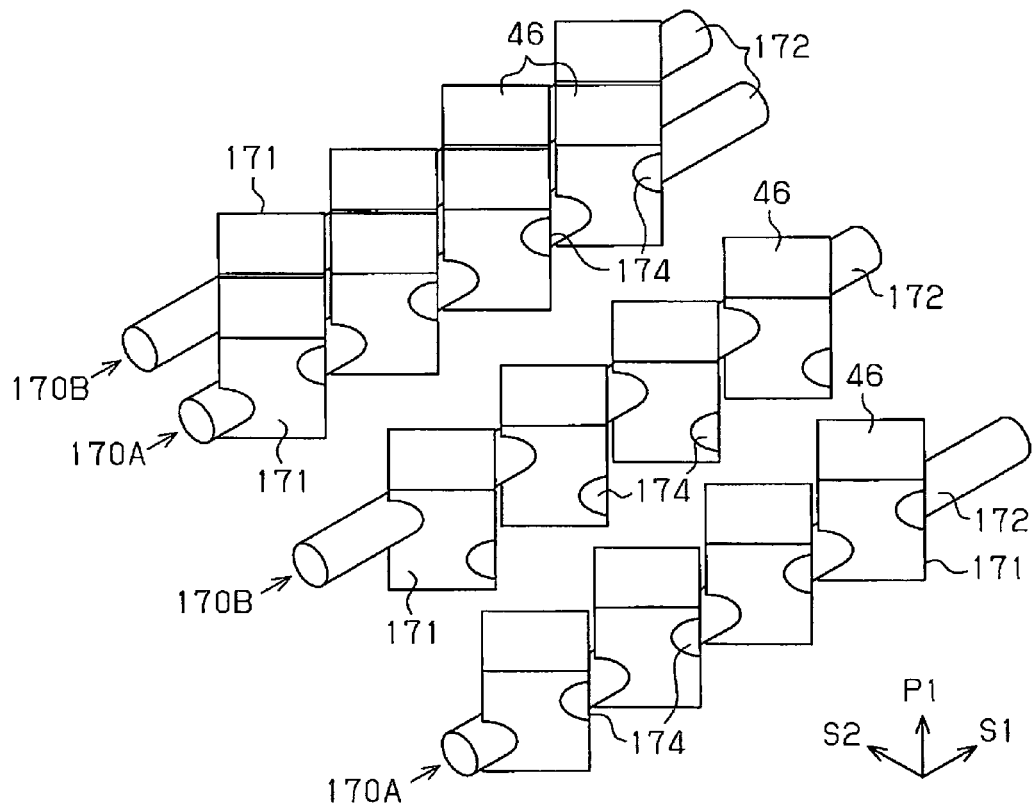
FIG. 16 is a perspective view showing a plurality of mirror blocks that are yet to be joined together.

As shown in FIGS. 15 and 16, an emitting-side fly-eye mirror 22 includes different types of mirror blocks 170A and 170B that are joined together. The mirror block 170A includes a coupling portion 172, which is arranged closer to the surface of each mirror element opposite to its mirror surface 46 than the mirror surface 46 in a vertical direction P1. The vertical direction P1 is perpendicular to an emitting-side setting surface 45a. The mirror block 170A includes an engagement space 174, which is arranged closer to the surface of each mirror element opposite to the mirror surface 46 than the mirror surface 46 in the vertical direction P1. More specifically, the engagement spaces 174 and the coupling portion 172 of the mirror block 170A are at different positions in the vertical direction P1.

The mirror block 170B is adjacent to the mirror block 170A in the second direction S2. The mirror block 170B includes a coupling portion 172, which is arranged closer to the surface of each mirror element opposite to its mirror surface 46 than the mirror surface 46 in the vertical direction P1. More specifically, the coupling portion 172 of the mirror block 170B is aligned with the engagement spaces 174 of the mirror block 170A in the vertical direction P1. The mirror block 170B includes an engagement space 174, which is arranged closer to the surface of each mirror element opposite to its mirror surface 46 than the mirror surface 46 in the vertical direction P1. More specifically, the engagement spaces 174 of the mirror block 170B are aligned with the coupling portion 172 of the mirror block 170A in the vertical direction P1.

In the present embodiment, the coupling portion 172 of one mirror block is at a position different from the positions of the engagement spaces 174 of the same mirror block in the vertical direction P1. This allows the coupling portion 172 of the present embodiment to have a longer length in the second direction S2, that is, to have a longer width, than the coupling portion of the second embodiment.

Figure 17A:
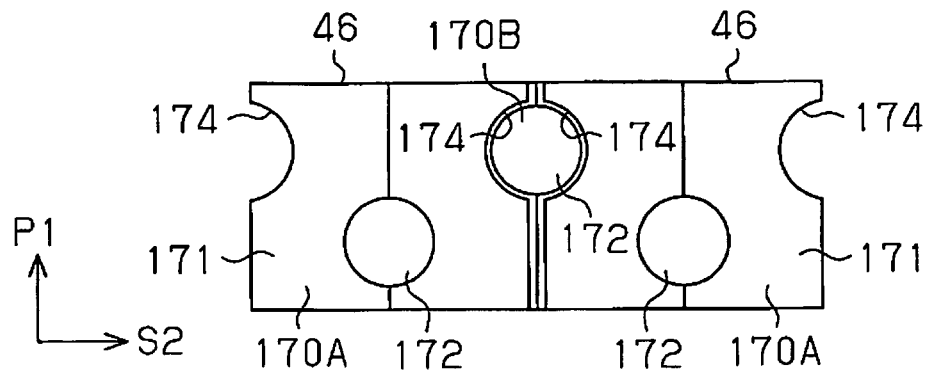
FIG. 17(a) is a front view showing three mirror blocks that have been joined together.
Figure 17B:
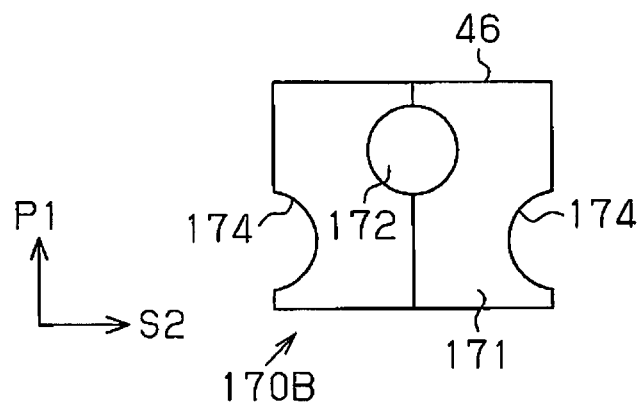
FIGS. 17(b) and 17(c) are front views each showing a single mirror block.
Figure 17C:
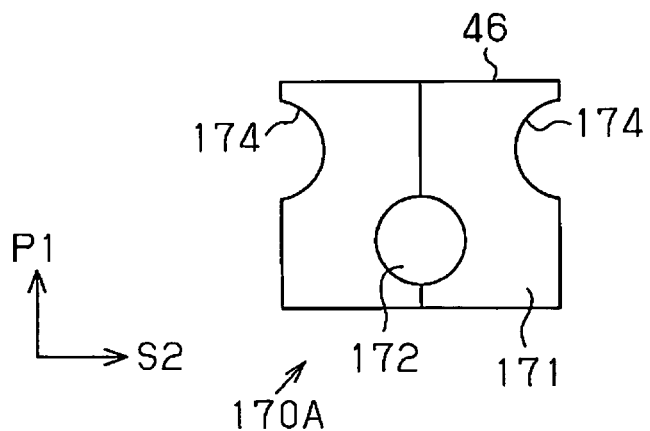

As shown in FIGS. 17(a), 17(b), and 17(c), when the mirror blocks 170A and 170B are joined together, the engagement spaces of the mirror block 170A accommodate a part of the coupling portion 172 of the mirror block 170B. Also, the engagement spaces 174 of the mirror block 170B accommodate a part of the coupling portion 172 of the mirror block 170A. More specifically, the coupling portions 172 of the mirror blocks 170A and 170B position the emitting-side mirror elements (second mirror elements) 171 of the mirror block (the second mirror block) 170B with the emitting-side mirror elements (first mirror elements) 171 of the mirror block (first mirror block) 170A.

Subsequently, when all of the mirror blocks 170A and 170B are joined together, the mirror blocks 170A and 170B are set on the emitting-side setting surface 45a. In the present embodiment as well, the mirror blocks 170A and 170B are positioned relative to each other and set on the emitting-side setting surface 45a. The method used for such setting is the same as described in the first embodiment, and will not be described.

The present embodiment has the same advantages as the advantages (2) to (6) of the first embodiment.

Sixth Embodiment

A sixth embodiment of the present invention will now be described with reference to FIGS. 18 and 19. The sixth embodiment differs from the first to fifth embodiments in the shape of the mirror blocks arranged in the emitting-side fly-eye mirror 22. Accordingly, the description hereafter will mainly focus on portions differing from the first to fifth embodiments. Same reference numerals are given to those components that are the same as the corresponding components of the first to fifth embodiments. Such components will now be described again.

Figure 18:
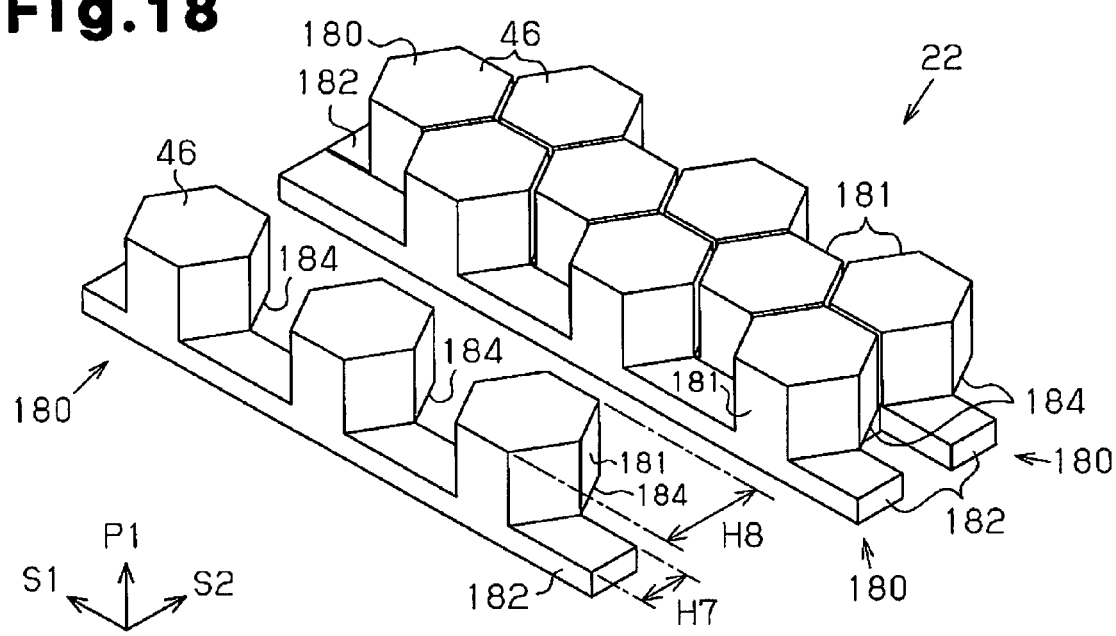
FIG. 18 is a perspective view schematically showing a plurality of mirror blocks that have been joined together in a sixth embodiment.

As shown in FIG. 18, each emitting-side mirror element 181 of an emitting-side fly-eye mirror 22 of the present embodiment includes a substantially hexagonal mirror surface 46 as viewed from above. The emitting-side fly-eye mirror 22 includes a plurality of mirror blocks 180.

Each mirror block 180 includes a plurality of emitting-side mirror elements 181, which are arranged in the first direction S1, and a coupling portion 182, which protrudes from the emitting-side mirror elements 181 at positions different from their mirror surfaces 46a. The emitting-side mirror elements 181 are arranged at predetermined intervals in the first direction S1. The coupling portion 182 is arranged opposite to the mirror surfaces 46 of the emitting-side mirror elements 181, and extends in the first direction S1. The length of the coupling portion 182 in the second direction S2, or a width H7 of the coupling portion 182, is less than one half of the length of each emitting-side mirror element 181 in the second direction S2, or a width H8 of each emitting-side mirror element 181. The −S2 side end of the coupling portion 182 is aligned with the −S2 side ends of the emitting-side mirror elements 181 in the second direction S2. The surfaces of the emitting-side mirror elements 181 opposite to their mirror surfaces 46 and the +S2 side surface of the coupling portion 182 define engagement spaces 184.

Figure 19:
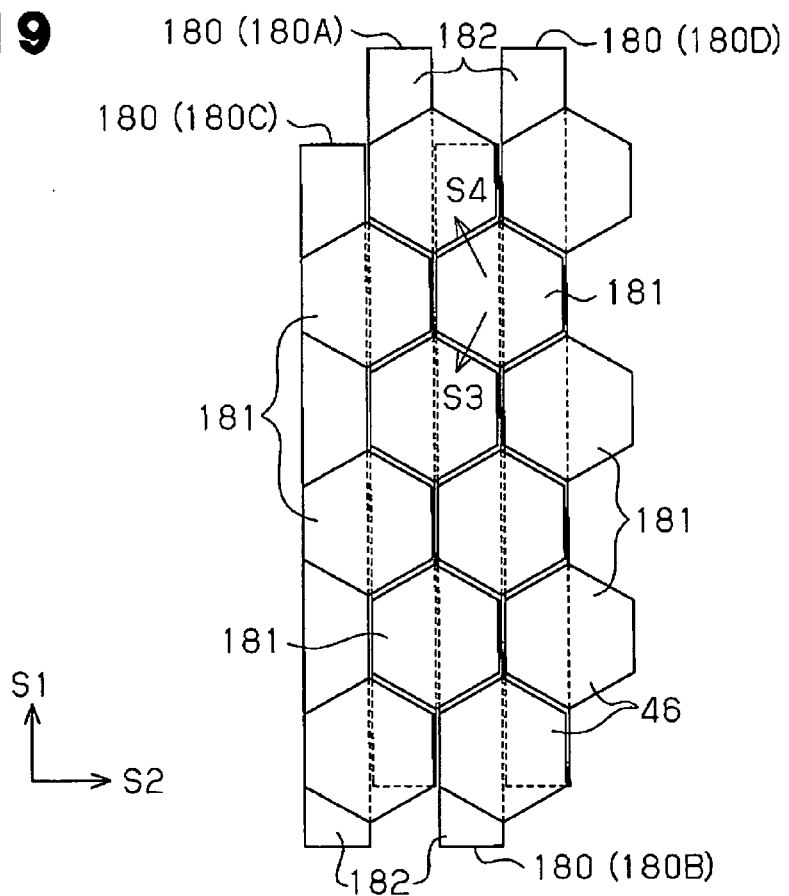
FIG. 19 is a plan view showing a plurality of mirror blocks that have been joined together.

As shown in FIG. 19, when the mirror blocks 180 are joined together, the engagement spaces 184 of the first mirror block 180A (180) accommodate a part of the coupling portion 182 of the second mirror block 180B (180) on the +S2 side of the first mirror block 180A. This couples the second mirror block 180B to the first mirror block 180A. Also, the engagement spaces 184 of the third mirror block 180C (180), which is on the −S2 side of the first mirror block 180A, accommodate a part of the coupling portion 182 of the first mirror block 180A. This couples the first mirror block 180A to the third mirror block 180C.

In this arrangement, each emitting-side mirror element 181 of the first mirror block 180A is adjacent to the corresponding emitting-side mirror element 181 of the second mirror block 180B so that their side surfaces face each other in the third direction S3 (refer to FIG. 19), which intersects with both of the first direction S1 and the second direction S2. Each emitting-side mirror element 181 of the first mirror block 180A is adjacent to the corresponding emitting-side mirror element 181 of the second mirror block 180B so that their side surfaces face each other in the fourth direction S4 (refer to FIG. 19), which intersects with the third direction S3. Further, each emitting-side mirror element 181 of the first mirror block 180A is adjacent to the corresponding emitting-side mirror element 181 of the fourth mirror block 180D, which is arranged on the −S2 side of the second mirror block 180B so that their side surfaces face each other.

Subsequently, when all of the mirror blocks 180 are joined together, the mirror blocks 180 are set on the emitting-side setting surface 45a. In the present embodiment as well, the mirror blocks 180 are positioned relative to each other and set on the emitting-side setting surface 45a. The method used for such setting is the same as described in the first embodiment, and will not be described.

The present embodiment has the advantage described below in addition to the advantages (1) and (3) to (6) of the above embodiments.

Seventh Embodiment

A seventh embodiment of the present invention will now be described with reference to FIGS. 20 and 21. The seventh embodiment differs from the sixth embodiment in the position of the coupling portion of the mirror block. Accordingly, the description hereafter will mainly focus on portions differing from the sixth embodiment. Same reference numerals are given to those components that are the same as the corresponding components of the sixth embodiment. Such components will now be described again.

Figure 20:
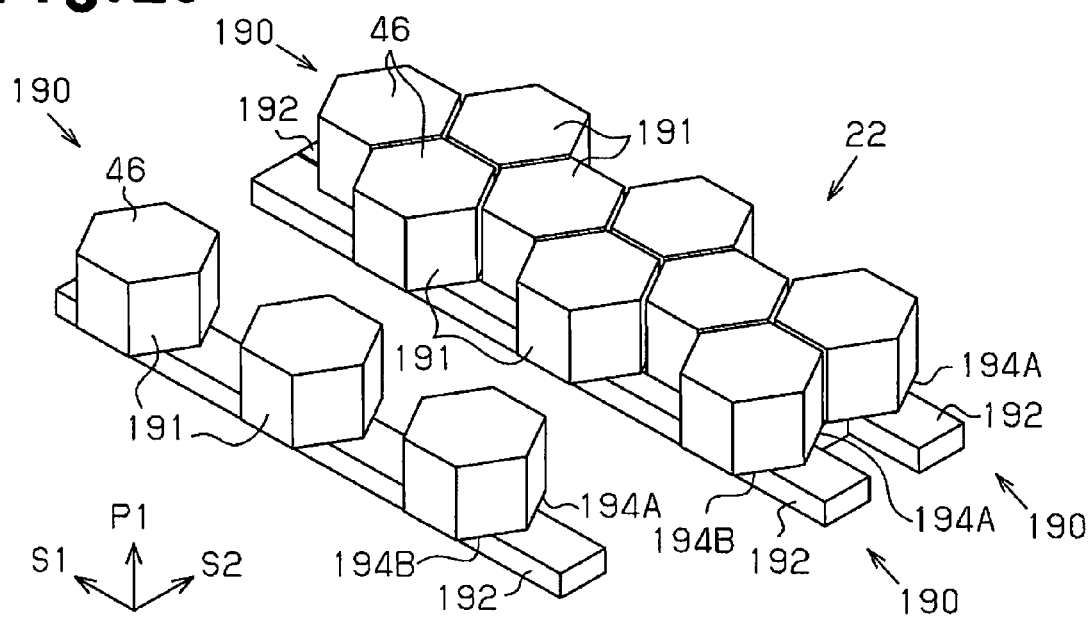
FIG. 20 is a perspective view showing a plurality of mirror blocks that have been joined together in a seventh embodiment.

As shown in FIG. 20, a mirror block 190 includes a coupling portion 192, which extends in the first direction S1, and a plurality of emitting-side mirror elements 191, which are arranged in the first direction S1. The coupling portion 192 is arranged in the middle of each emitting-side mirror element 191 in the second direction S2. The surface of each emitting-side mirror element 191 opposite to its mirror surface 46 and the +S2 side surface of the coupling portion 192 define a first engagement space 194A. The surface of each emitting-side mirror element 191 opposite to its mirror surface 46 and the −S2 side surface of the coupling portion 192 define a second engagement space 194B.

Figure 21:
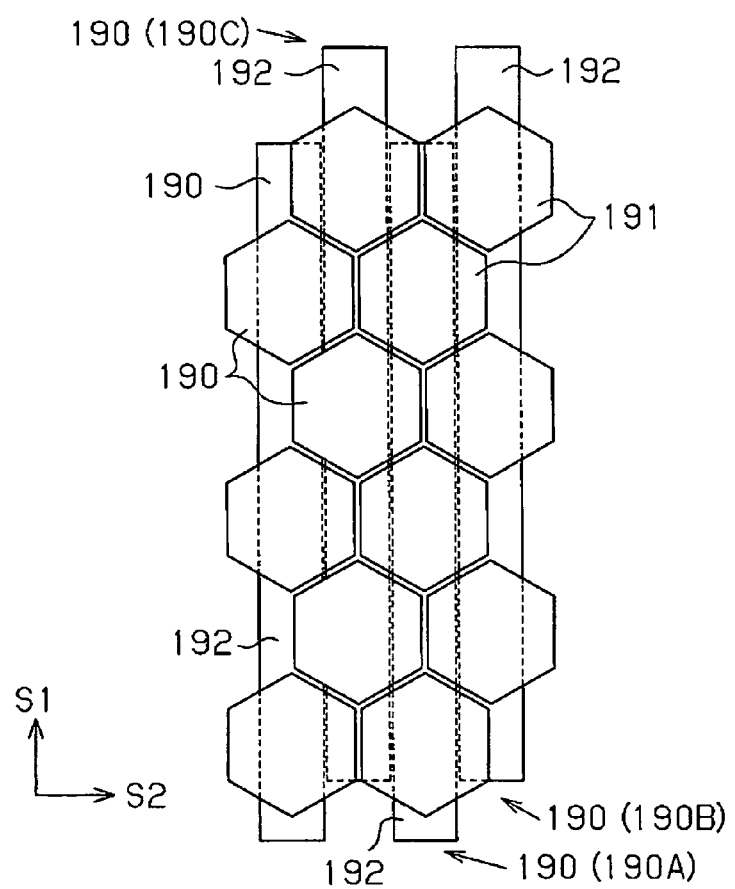
FIG. 21 is a plan view showing a plurality of mirror blocks that have been joined together.

As shown in FIG. 21, when the mirror blocks 190 are joined together, the first engagement spaces 194A of the first mirror block 190A accommodate a part of the coupling portion 192 of the second mirror block 190B, which is on the +S2 side of the first mirror block 190A. This couples the second mirror block 190B to the first mirror block 190A. The second engagement spaces 194B of the first mirror block 190A accommodate a part of the coupling portion 192 of the third mirror block 190C, which is on the −S2 side of the first mirror block 190A. This couples the third mirror block 190C to the first mirror block 190A.

The present embodiment has the same advantages as the advantages (1) and (3) to (6) of the above embodiments.

Eighth Embodiment

An eighth embodiment of the present invention will now be described with reference to FIG. 22. The eighth embodiment differs from the first to seventh embodiments in the shape of the coupling portion of the mirror block. Accordingly, the description hereafter will mainly focus on portions differing from the first to seventh embodiments. Same reference numerals are given to those components that are the same as the corresponding components of the first to seventh embodiments. Such components will now be described again.

Figure 22:
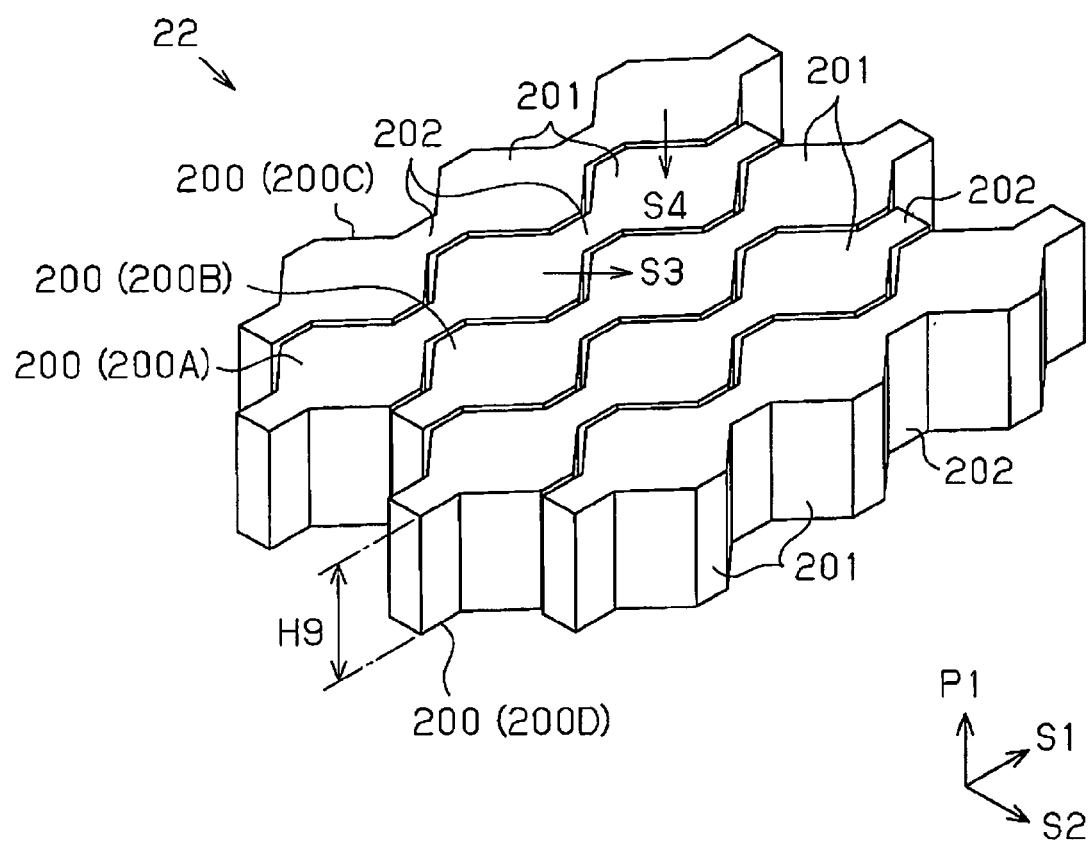
FIG. 22 is a perspective view showing a plurality of mirror blocks that have been joined together in an eighth embodiment.

As shown in FIG. 22, a mirror block 200 of an emitting-side fly-eye mirror 22 of the present embodiment includes a plurality of (three in FIG. 22) emitting-side mirror elements 201, which are arranged in the first direction S1. The mirror block 200 further includes a coupling portion 202, which protrudes in the first direction S1 from each emitting-side mirror element 201 at a position different from its mirror surface 46 (side wall in the first direction S1). A thickness H9 of the coupling portion 202 (that is, the length in the vertical direction P1 perpendicular to the emitting-side setting surface 45a) is substantially the same as the length of each emitting-side mirror element 201 in the vertical direction P1.

The mirror block 200 includes no spaces for accommodating the coupling portion 202 of another mirror block 200 adjacent in the second direction S2 (corresponding to the engagement spaces in the above embodiments).

When the mirror blocks 200 are joined together, the second mirror block 200B (200) is arranged on the +S2 side of the first mirror block 200A (200), the fourth mirror block 200D (200) is arranged on the −S2 side of the second mirror block 200B, and the third mirror block 200C (200) is arranged on the −S2 side of the first mirror block 200A.

Each emitting-side mirror element 201 of the first mirror block 200A is adjacent to the corresponding emitting-side mirror element 201 of the second mirror block 200B so that their side surfaces face each other in the third direction S3, which intersects with both of the first direction S1 and the second direction S2. Each emitting-side mirror element 201 of the first mirror block 200A is adjacent to the corresponding emitting-side mirror element 201 of the second mirror block 200B so that their side surfaces face each other in the fourth direction S4, which intersects with the third direction S3. Likewise, each emitting-side mirror element 201 of the first mirror block 200A is adjacent to the corresponding emitting-side mirror element 201 of the third mirror block 200C so that their side surfaces face each other in the third direction S3. Each emitting-side mirror element 201 of the first mirror block 200A is adjacent to the corresponding emitting-side mirror element 201 of the third mirror block 200C so that their side surfaces face each other in the fourth direction S4.

Further, each emitting-side mirror element 201 of the first mirror block 200A faces the corresponding emitting-side mirror element 201 of the fourth mirror block 200D with the coupling portion 202 of the second mirror block 200B being arranged between these mirror elements.

Subsequently, when all of the mirror blocks 200 are joined together, the mirror blocks 200 are set on the emitting-side setting surface 45a. In the present embodiment as well, the mirror blocks 200A to 200D are positioned relative to each other and set on the emitting-side setting surface 45a. The method used for such setting is the same as described in the first embodiment, and will not be described.

The present embodiment has the advantage described below in addition to the advantages (1) and (3) to (8) of the above embodiments.

(9) Unlike the mirror blocks 200 of the above embodiments, the mirror blocks 200 (200A to 200D) of the present embodiment eliminate the need to form spaces (engagement spaces) for accommodating a part of the coupling portion 202. This enables the mirror blocks 200 to be processed easily.

This structure allows the coupling portion 202 to have a larger thickness H9, and thereby have a higher strength. This enables the mirror blocks 200 to be joined together easily.

The above embodiments may be modified in the following forms.

In the first to fourth embodiments and the sixth and seventh embodiments, the coupling portions 52, 142, 152, 162, 182, and 192 may be arranged closer to the mirror surfaces 46 than the surfaces opposite to the mirror surfaces 46 in the vertical direction P1.

In the above embodiments, the mirror surface 46 of each emitting-side mirror element M may be in any shape other than a square or a hexagon, such as a triangle, a circle, or an oval.

In the above embodiments, the mirror blocks are arranged with a little gap left between the adjacent blocks on the emitting-side setting surface 45a. Alternatively, the adjacent mirror blocks may be in contact with each other when the emitting-side fly-eye mirror 22 can achieve the performance (including reflection characteristics) necessary for the exposure apparatus 11.

In the first embodiment, the emitting-side fly-eye mirror 22 may include only one type of mirror blocks selected from the mirror blocks 50A to 50I. Alternatively, the emitting-side fly-eye mirror 22 may include mirror blocks that differ from the mirror blocks 50A to 50I in the number of emitting-side mirror elements 51 or in the arrangement of the emitting-side mirror elements 51.

In the third embodiment, the mirror blocks of the emitting-side fly-eye mirror 22 may not be four types of mirror blocks. The emitting-side fly-eye mirror 22 may include any number of (e.g., six) different types of mirror blocks that are two or more types of mirror blocks. The length H3 and the width H4 of the coupling portion 152 of each of such mirror blocks are determined in accordance with the number of mirror blocks (N).

The present invention may be embodied as an incident-side fly-eye mirror 21. As shown in FIGS. 23(a) and 23(b), for example, the incident-side fly-eye mirror 21 includes a plurality of incident-side mirror elements 41, each of which includes a plurality of mirror blocks 210 arranged in the first direction S1. As shown in FIG. 23(a) and FIG. 24, a space for accommodating an incident-side mirror element 41 of another mirror block 210B (210) is formed between incident-side mirror elements 41 of one mirror block 210A (210). A coupling portion 212, which protrudes in the first direction S1, is arranged on the +S2 side of each incident-side mirror element 41 of one mirror block 210A. In FIG. 23(a), the coupling portion 212 may come in contact with the incident-side setting surface 40a. Each incident-side mirror element 41 of the mirror block 210A may include an engagement space 214 on the −S2 side, which accommodates the coupling portion 212 of the other mirror block 210B.

As shown in FIG. 24, the mirror block 210A and the other mirror block 210B are joined together to form a line of mirrors extending in the first direction S1. Such mirror lines are arranged in the second direction S2 to form the incident-side fly-eye mirror 21.

Each incident-side mirror element 41 of the other mirror block 210B includes an engagement space 214 for accommodating the coupling portion 212 of the mirror block 210A at the position corresponding to the coupling portion 212 of the mirror block 210A.

As described above, the incident-side fly-eye mirror 21 embodying the present invention not only improves the reflectivity but also achieves the reflected light with a uniform intensity, and accordingly enables the reticle to be illuminated with light having a uniform illumination.

It is preferable that the incident-side mirror elements 41 adjacent in the first direction S1 and the second direction S2 are in contact with each other. With no gap between the incident-side mirror elements 41, this structure reduces loss of light in the incident-side fly-eye mirror 21.

In the above embodiments, a heat conductive layer, which is formed from a material having a higher heat conductivity and a lower rigidity (e.g., copper) than the material for the mirror block, may be arranged between the mirror block and the setting surfaces 40a and 45a.

In the above embodiments, in addition to an exposure apparatus used to manufacture microdevices such as semiconductor elements, the exposure apparatus 11 may be an exposure apparatus for transferring a circuit pattern from a mother reticle to a glass substrate or to a silicon wafer when manufacturing a reticle or a mask used in a light exposure apparatus, an EUV exposure apparatus, an X-ray exposure apparatus, and an electron beam exposure apparatus. Alternatively, the exposure apparatus 11 may be an exposure apparatus for transferring a device pattern onto a glass plate in manufacturing a display such as a liquid crystal display (LCD), an exposure apparatus for transferring a device pattern onto a ceramic wafer or the like, or an exposure apparatus used in a manufacturing an imaging device such as a charge-coupled device (CCD).

In the above embodiments, the material for generating EUV light used in the light source unit 12 may be gaseous tin (Sn), or liquid or solid tin. Alternatively, the material for generating EUV light may be xenon (Xe).

In the above embodiments, the light source unit 12 may include a light source that can supply g-rays (436 nm), i-rays (365 nm), KrF excimer laser light (248 nm), $F_2$ laser light (157 nm), $Kr_2$ laser light (146 nm), and $Ar_2$ laser light (126 nm). The light source unit 12 may be a light source that can supply harmonics obtained by amplifying light having a single wavelength, such as infrared light or visible light, oscillated from a DFB semiconductor laser or a fiber laser with a fiber amplifier that is doped with, for example, erbium (or both erbium and ytterbium), and converting the wavelength of the resulting light to the wavelength of ultraviolet light using a nonlinear optical crystal.

In the above embodiments, the light source unit 12 may include a discharge-type plasma light source.

In the above embodiments, the exposure apparatus 11 may be a step-and-repeat exposure apparatus.

In the above embodiments, the coupling portion may be linear or curved.

The engagement spaces may be grooves, cutouts, steps, or recesses.

When a plurality of mirror elements of a first mirror block and a plurality of mirror elements of a second mirror block are arranged densely with gaps based on tolerances being left between adjacent mirror elements, the plurality of mirror elements of the second mirror block may include a plurality of engagement portions that are shaped to receive the coupling bodies of the first mirror block. Alternatively, the plurality of mirror elements of the first mirror block may include a plurality of coupling portions shaped to receive the coupling bodies of the second mirror block. The plurality of mirror elements of the first mirror block each have the same shape, and the plurality of mirror elements of the second mirror block may each have the same shape.

The plurality of first mirror elements refer to a plurality of mirror elements including a first mirror element arranged in the first mirror block including the plurality of mirror elements. The plurality of second mirror elements refer to a plurality of mirror elements arranged in the second mirror block.

Figure 25:
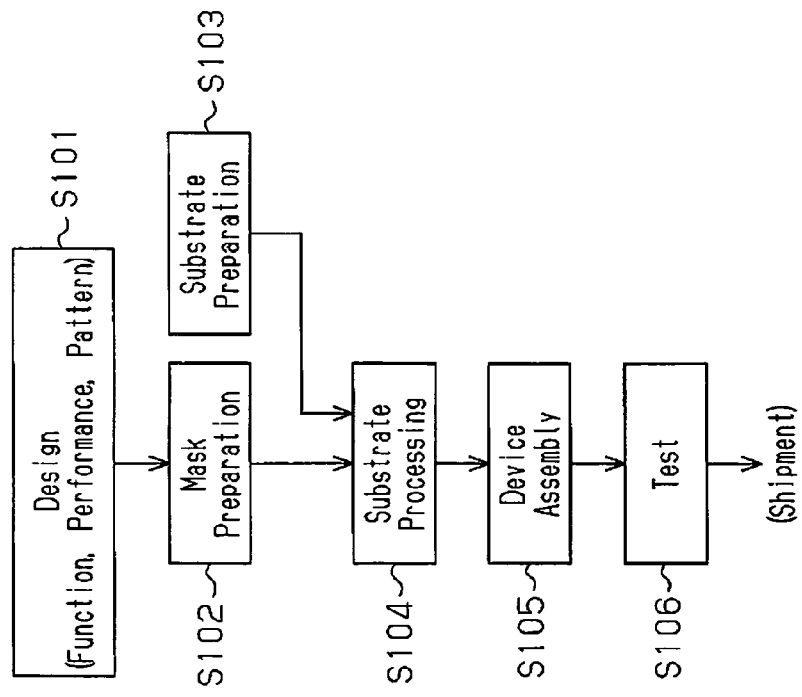
FIG. 25 is a flowchart illustrating an example of a method for manufacturing a device.

A method for manufacturing a microdevice including a lithography process that is implemented by a method for manufacturing a device with the exposure apparatus 11 according to the embodiments of the present invention will now be described. FIG. 25 is a flowchart illustrating an example of a method for manufacturing a microdevice (a semiconductor chip, such as an IC and an LSI, a liquid crystal panel, a CCD, a thin-film magnetic head, and a micromachine).

First, in step S101 (design step), the functions and the performance of a microdevice are designed (e.g., the circuit of a semiconductor device is designed), and a pattern for enabling such functions is designed. Subsequently, in step S102 (mask preparation step), a mask (e.g., a reticle R) having the designed circuit pattern is prepared. In step S103 (substrate preparation step), a substrate (wafer W when silicon is used) is prepared from a material such as silicon, glass, or ceramics.

Subsequently, in step S104 (substrate processing step), the mask and the substrate prepared in steps S101 to S104 are used to form an actual circuit and the like on the substrate by, for example, lithography. Subsequently, in step S105 (device assembly step), the substrate processed in step S104 is used to assemble the device. The processing in step S105 includes dicing, bonding, and packaging (chip encapsulation) as necessary. Finally, in step S106 (test step), the operation, durability, and the like of the microdevice completed in step S105 are tested. The microdevice completed through these processes is shipped out of a factory.

Figure 26:
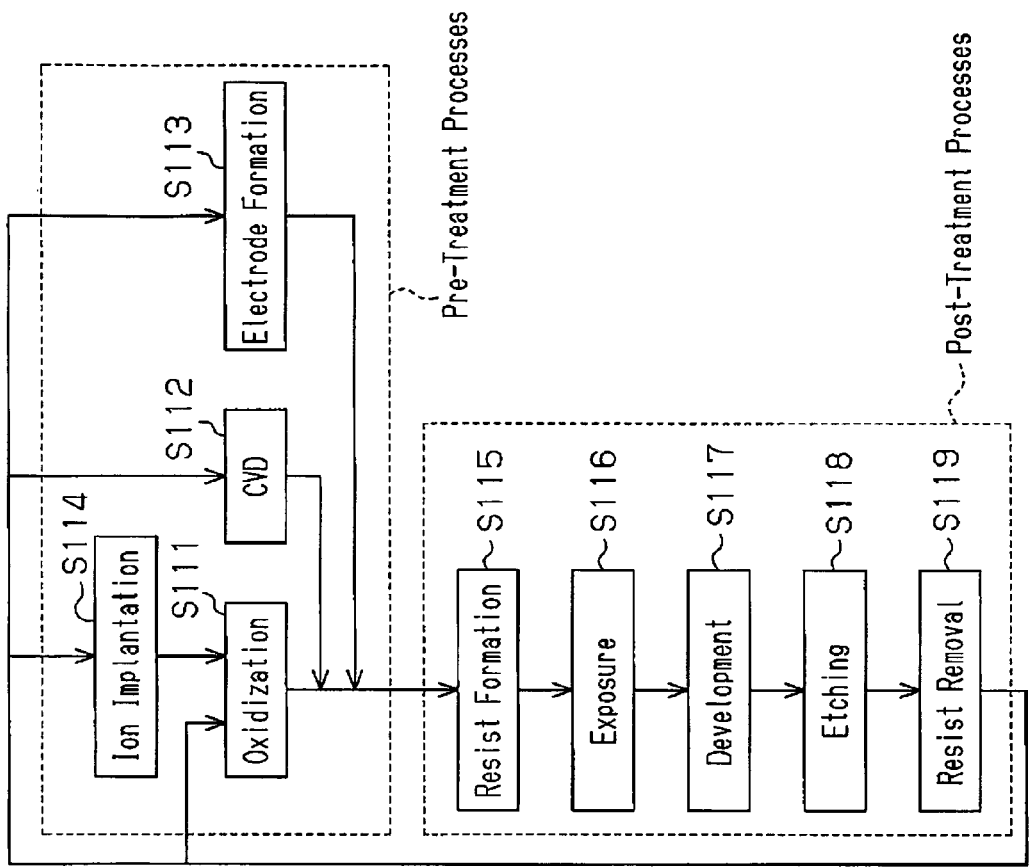
FIG. 26 is a detailed flowchart related to substrate processing for a semiconductor device.

FIG. 26 shows an example of detailed processing performed in step S104 when the device to be manufactured is a semiconductor device.

In step S111 (oxidization step), the surface of the substrate is oxidized. In step S112 (CVD step), an insulation film is formed on the surface of the substrate. In step S113 (electrode formation step), electrodes are deposited on the substrate. In step S114 (ion implantation step), ions are implanted into the substrate. Steps S111 to S114, which serve as pre-treatment processes for each stage of substrate processing, are selectively performed as necessary in each stage.

The pre-treatment processes are completed in each stage of substrate processing, and are followed by post-treatment processes, which will now be described. First, in step S115 (resist formation step), a photosensitive material is applied onto the substrate. Subsequently, in step S116 (exposure step), a mask circuit pattern is transferred onto the substrate by a lithography system (exposure apparatus 11). Subsequently, in step S117 (development step), the substrate exposed in step S116 is developed to form a mask layer having a circuit pattern on the surface of the substrate. Subsequently, in step S118 (etching step), the exposure material in areas excluding where the resist remains is removed by etching. In step S119 (resist removing step), the used photosensitive material after the etching is removed. More specifically, the surface of the substrate is processed through the mask layer in steps S118 and S119. The pre-treatment processes and the post-treatment processes are performed repeatedly to form multiple layers of circuit patterns onto the substrate.

Although the embodiments of the present inventions have been described in detail, it should be understood that the various changes, substitutions, and alterations could be made hereto within the scope and equivalence of the appended claims.

DESCRIPTION OF REFERENCE CHARACTERS 11 exposure apparatus
14 illumination optical system
20 fly-eye optical system
21, 22 fly-eye mirror as example of reflective optical member
40 incident-side setting base as example of base
40a incident-side setting surface
41 incident-side mirror element
41a, 46 mirror surface as reflective portion
45 emitting-side setting base as example of base
45a emitting-side setting surface
50, 50A to 50I, 140, 140A to 140C, 150A to 150D, 160A, 160B, 170A, 170B, 180, 180A to 180D, 190, 190A to 190C, 200, 200A to 200D, 210, 210A, 210B mirror block
51, 51A to 51F, 141, 141A to 141D, 151, 151A to 151D, 161, 161A to 161G, 171, 181, 191, 201, M emitting-side mirror element
52, 62, 152, 162, 182, 192 coupling portion that also functions as support
54, 64, 74, 84, 94, 104, 114, 124, 134, 144, 154, 164, 174, 184, 194A, 194B, 214 engagement space as example of engagement portion
142, 172, 202, 212 coupling portion
EL exposure light
R reticle as example of mask
W wafer as example of substrate

The invention claimed is:
1. A reflective optical member including a plurality of mirror elements that are set on a setting surface of a base, wherein each mirror element includes a reflective portion that reflects light, the reflective optical member comprising:
a first mirror block including a first mirror element among the plurality of mirror elements; and
a second mirror block including a second mirror element among the plurality of mirror elements, wherein the first mirror block includes a coupling portion that protrudes from the first mirror element at a portion differing from the reflective portion of the first mirror element, and the second mirror element includes an engagement portion that is engaged with the coupling portion.

2. The reflective optical member according to claim 1, further comprising a third mirror block including a third mirror element among the mirror elements, wherein the coupling portion positions two or more mirror elements including the second mirror element and the third mirror element relative to the first mirror element.

3. The reflective optical member according to claim 2, wherein the engagement portion is engaged with the coupling portion of the first mirror block to position the second mirror block relative to the first mirror block within the setting surface.

4. The reflective optical member according to claim 2, wherein the coupling portion protrudes from the mirror element in a first direction extending along the setting surface at a portion differing from the reflective portion of the mirror element, and the coupling portion has a width in a second direction intersecting the first direction within the setting surface that is narrower than a width of the mirror element in the second direction.

5. The reflective optical member according to claim 4, wherein the first mirror block includes a plurality of first mirror elements including the first mirror element that are arranged at different positions in the first direction, and the plurality of first mirror elements are coupled to each other by the coupling portion.

6. The reflective optical member according to claim 5, wherein the first mirror block includes a mirror element arranged most outwardly at one side in the first direction among the plurality of first mirror elements, and a mirror element arranged most outwardly at the other side in the first direction among the plurality of first mirror elements.

7. The reflective optical member according to claim 4, wherein the second mirror block further includes a coupling portion that protrudes from the second mirror element in the first direction at a portion differing from the reflective portion of the second mirror element, the coupling portion of the second mirror block is located at a position differing from the coupling portion of the first mirror block in a direction perpendicular to the setting surface, and the first mirror element of the first mirror block includes an engagement portion that is arranged at the same position as the coupling portion of the second mirror block in the perpendicular direction, and is engaged with the coupling portion.

8. The reflective optical member according to claim 5, wherein the first mirror block includes the first mirror element and a fourth mirror element that are arranged in the first direction, the first mirror element is adjacent to the second mirror element so that a side surface of the first mirror element and a side surface of the second mirror element face each other in a third direction that extends along the setting surface and intersects the first direction and the second direction, the fourth mirror element is adjacent to the second mirror element so that a side surface of the fourth mirror element and a side surface of the second mirror element face each other in a fourth direction extending along the setting surface and intersecting the first, second, and third directions, and the coupling portion of the first mirror block couples the first mirror element and the fourth mirror element.

9. The reflective optical member according to claim 5, wherein the first mirror block includes the first mirror element and a fourth mirror element that are arranged in the first direction, the first mirror element is adjacent to the second mirror element in the first direction, the fourth mirror element is adjacent to the second mirror element in the first direction, and the coupling portion couples the first mirror element and the fourth mirror element.

10. The reflective optical member according to claim 5, wherein the first mirror block includes the first mirror element, a fourth mirror element, and a fifth mirror element that are arranged at different positions in the first direction, the first mirror element is adjacent to the second mirror element in the first direction, the fourth mirror element is adjacent to the second mirror element in a second direction that extends along the setting surface and intersects the first direction, the fifth mirror element is adjacent to the second mirror element in the first direction, and the coupling portion of the first mirror block couples the first mirror element, the fourth mirror element, and the fifth mirror element.

11. The reflective optical member according to claim 2, wherein the coupling portion of the first mirror block extends in a first direction extending along the setting surface, the coupling portion has a width in a second direction intersecting the first direction within the setting surface is less than one half of a width of the first mirror element in the second direction, and the first mirror element is arranged at one side of the coupling portion in the first direction, and is set on the setting surface by the coupling portion.

12. The reflective optical member according to claim 11, wherein the second mirror block includes a coupling portion that extends in the first direction, the coupling portion has a width in the second direction that is less than one half of a width of the second mirror element in the second direction, and the second mirror element is arranged at the other side of the first mirror element in the first direction, and is set on the setting surface by the coupling portion.

13. The reflective optical member according to claim 12, wherein the coupling portion of the second mirror block is arranged at a position differing from a position of the coupling portion of the first mirror block in the second direction.

14. The reflective optical member according to claim 11, wherein the coupling portion has a length in the first direction corresponding to an N number of mirror elements, where N is a natural number greater than or equal to 2, and the coupling portion has a width of in the second direction that is less than or equal to 1/N of a width of the mirror element in the second direction.

15. The reflective optical member according to claim 1, wherein
the second mirror block further includes a coupling portion that protrudes from the mirror element at a portion differing from the reflective portion of the mirror element, and the coupling portion of the second mirror block is coupled to the first mirror block, and
the first mirror block further includes an engagement portion that is engaged with the coupling portion of the second mirror block.

16. The reflective optical member according to claim 1, wherein each of the first mirror block and the second mirror block includes a support that supports the mirror element of the mirror block.

17. An optical system comprising:
a pair of reflective optical members including a plurality of mirror elements,
wherein at least one of the pair of reflective optical members is the reflective mirror element according to claim 1.

18. An exposure apparatus that projects an image of a pattern formed by illuminating a mask having a predetermined pattern with light emitted from an illumination optical system,
wherein the illumination optical system includes the optical system according to claim 17.

19. A method for manufacturing a device comprising a lithography process,
wherein the lithography process is performed by using the exposure apparatus according to claim 18.

20. A reflective optical member including a plurality of mirror elements that are set on a setting surface of a base, wherein each mirror element includes a reflective portion that reflects light, the reflective optical member comprising:
a first mirror block including at least a first mirror element and a second mirror element among the plurality of mirror elements; and
a second mirror block including at least a third mirror element among the plurality of mirror elements, wherein
the first mirror block includes a coupling portion that protrudes from the first mirror element and the second mirror element at portions differing from the reflective portions of the first mirror element and the second mirror element, and the second mirror element includes an engagement portion that is engaged with the coupling portion to position the third mirror element so that the third mirror element is adjacent to the first mirror element and the second mirror element.

21. The reflective optical member according to claim 20, wherein the coupling portion positions the third mirror element so that the third mirror element is located between the first mirror element and the second mirror element.

22. A reflective optical member including a plurality of mirror elements, wherein each mirror element includes a reflective portion that reflects light, the reflective optical member comprising:
a first mirror block including a first mirror element among the mirror elements; and
a second mirror block including a second mirror element among the mirror elements, wherein
the first mirror block includes a coupling portion that protrudes from the first mirror element at a portion differing from the reflective portion of the first mirror element, and
the second mirror element includes an engagement portion that is engaged with the coupling portion.

23. An exposure apparatus that projects an image of a pattern formed by illuminating a mask having a predetermined pattern with light emitted from an illumination optical system comprising a pair of reflective optical members,
wherein a reflective optical member of the pair of reflective optical members comprises:
a first mirror block including a first mirror element among a plurality of mirror elements; and
a second mirror block including a second mirror element among the plurality of mirror elements, wherein
the first mirror block includes a coupling portion that protrudes from the first mirror element at a portion differing from the reflective portion of the first mirror element, and the coupling portion is coupled to the second mirror block, and
the coupling portion positions two or more of the plurality of mirror elements including the second mirror element relative to the first mirror element.

24. A method for manufacturing a device comprising a lithography process,
wherein the lithography process is performed by using the exposure apparatus according to claim 23.

* * * * *